(12) United States Patent
Akahane

(10) Patent No.: US 10,841,071 B2
(45) Date of Patent: *Nov. 17, 2020

(54) DATA COMMUNICATION SYSTEM, DATA COMMUNICATION APPARATUS, AND SENSOR APPARATUS

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/847,279

(22) Filed: Apr. 13, 2020

(65) Prior Publication Data

US 2020/0244432 A1 Jul. 30, 2020

Related U.S. Application Data

(63) Continuation of application No. 16/266,840, filed on Feb. 4, 2019, now Pat. No. 10,644,866, which is a (Continued)

(51) Int. Cl.
*H04B 3/02* (2006.01)
*H04L 7/00* (2006.01)
(Continued)

(52) U.S. Cl.
CPC .............. *H04L 7/0008* (2013.01); *G06F 1/04* (2013.01); *G06F 1/10* (2013.01); *G06F 13/40* (2013.01);
(Continued)

(58) Field of Classification Search
CPC ................................ H04L 7/0008; H04B 3/02
USPC ........................................................ 375/354
See application file for complete search history.

(56) References Cited

U.S. PATENT DOCUMENTS 4,282,601 A 8/1981 Flora
5,210,846 A 5/1993 Lee
(Continued)

FOREIGN PATENT DOCUMENTS

CN 104348689 A 2/2015
GB 2287622 A 9/1995
(Continued)

*Primary Examiner* — Qutbuddin Ghulamali
(74) *Attorney, Agent, or Firm* — Rabin & Berdo, P.C.

(57) ABSTRACT

A data communication system, including master-side and slave-side data communication apparatuses configured to perform bidirectional communication with each other via a single-wire communication line. The master-side data communication apparatus includes first and second transistors performing switching according respectively to an input clock and write data, and a master-side data reproduction circuit reproducing read data transmitted from the slave-side. The slave-side data communication apparatus includes a clock reproduction circuit and a slave-side data reproduction circuit configured to respectively reproduce the input clock and the write data transmitted from the master-side, and a third transistor performing switching both according to the input clock reproduced by the clock reproduction circuit and according to the read data.

21 Claims, 24 Drawing Sheets

Related U.S. Application Data continuation of application No. 15/366,992, filed on Dec. 1, 2016, now Pat. No. 10,200,186, which is a continuation of application No. PCT/JP2015/067201, filed on Jun. 15, 2015.

(51) Int. Cl.

| | | |
|---|---|---|
| H04L 25/49 | (2006.01) | |
| G06F 13/40 | (2006.01) | |
| G06F 1/04 | (2006.01) | |
| G06F 1/10 | (2006.01) | |
| H04Q 9/00 | (2006.01) | |
| H03K 17/567 | (2006.01) | |

(52) U.S. Cl.
CPC ............ *H03K 17/567* (2013.01); *H04B 3/02* (2013.01); *H04L 25/49* (2013.01); *H04Q 9/00* (2013.01); *H04Q 2209/30* (2013.01); *H04Q 2209/70* (2013.01)

(56) References Cited

U.S. PATENT DOCUMENTS

| | | | |
|---|---|---|---|
| 5,251,234 A * | 10/1993 | Iida | H04L 5/1423 327/108 |
| 5,600,634 A | 2/1997 | Satoh et al. | |
| 9,639,500 B2 * | 5/2017 | Bas | G06F 13/4295 |
| 9,762,229 B2 * | 9/2017 | Kim | G06K 7/10247 |
| 2002/0149984 A1 | 10/2002 | Nishikawa et al. | |
| 2004/0027872 A1 * | 2/2004 | Nishikawa | G01D 3/022 365/200 |
| 2008/0279320 A1 * | 11/2008 | Rocas | H04L 7/044 375/355 |
| 2010/0201373 A1 | 8/2010 | Sato et al. | |
| 2012/0027104 A1 | 2/2012 | Bas et al. | |
| 2012/0030388 A1 * | 2/2012 | Bas | G06F 13/4295 710/106 |
| 2012/0206091 A1 * | 8/2012 | Tanaka | H04L 5/1423 320/107 |
| 2015/0039801 A1 * | 2/2015 | Mori | G06F 13/4072 710/305 |
| 2017/0222618 A1 | 8/2017 | Gasser et al. | |
| 2019/0173660 A1 * | 6/2019 | Akahane | G06F 1/10 |

FOREIGN PATENT DOCUMENTS

| | | |
|---|---|---|
| JP | H02276348 A | 11/1990 |
| JP | H07264250 A | 10/1995 |
| JP | 2002310735 A | 10/2002 |
| JP | 2011055312 A | 3/2011 |
| JP | 2012169746 A | 9/2012 |

* cited by examiner

| No. | NAME | 3-BIT REGISTER VALUE | FUNCTION |
|---|---|---|---|
| 1 | OUTPUT | 000 | SERIAL DATA OUTPUT |
| 2 |  | 001 | BLANK |
| 3 | REFERENCE | 010 | SET CONTENT OF EPROM TO S.R. |
| 4 | ADJUSTMENT | 011 | OUTPUT OR OF CONTENTS OF S.R. AND EPROM TO D/A CONVERTER |
| 5 | WRITE | 100 | WRITE CONTENT OF S.R. TO EPROM |
| 6 |  | 101 | BLANK |
| 7 |  | 110 | BLANK |
| 8 | RESET | 111 | RESET S.R. AND MODE SETTING |

| STATE NAME | CONTENT |
|---|---|
| POWER ON | AFTER POWER ON, TRANSITION TO "Init" BY RESET OPERATION OF CONTROL CIRCUIT. |
| Init | INITIAL STATE. TRANSITION TO "MODE SETTING" BY CLOCK INPUT. |
| MODE SETTING | PERFORM 3-BIT MODE SETTING BY SHIFT OPERATION USING 3 CLOCKS.<br>TRANSITION TO "EXECUTION" UPON 3-BIT SETTING. |
| EXECUTION | ANALYZE (DECODE) MODE SETTING VALUE, AND TRANSITION TO "Init" WHEN RESETTING (111).<br>TRANSITION TO "SHIFT" WHEN OTHER THAN RESETTING (EXCEPT FOR BLANK CODE). |
| SHIFT | SHIFT DATA IN 48-BIT SHIFT REGISTER BY CLOCK INPUT. |
| RESTART | UPON COMPLETION OF 48-BIT SHIFT OPERATION, INITIALIZE MODE REGISTER AT NEXT CLOCK AND TRANSITION TO Init. |
| WRITE TO EPROM ANALOG MEASUREMENT | UPON COMPLETION OF 48-BIT SHIFT OPERATION, WRITING TO EPROM (VOLTAGE APPLICATION TO CG, EV) OR MEASUREMENT OF ANALOG VALUE IS ALLOWED UNTIL NEXT CLOCK INPUT. |

DATA COMMUNICATION SYSTEM, DATA COMMUNICATION APPARATUS, AND SENSOR APPARATUS

CROSS-REFERENCE TO RELATED APPLICATION

This application is a continuation of U.S. application Ser. No. 16/266,840, filed on Feb. 4, 2019, which is a continuation of U.S. application Ser. No. 15/366,992, filed on Dec. 1, 2016, (now U.S. Pat. No. 10,200,186, issued on Feb. 5, 2019), which is a continuation application of International Application PCT/JP2015/067201 filed on Jun. 15, 2015 which designated the U.S., the entire contents of which are incorporated herein by reference.

BACKGROUND OF THE INVENTION

1. Field of the Invention

The embodiments discussed herein relate to a data communication system, a data communication apparatus, and a sensor apparatus.

2. Background of the Related Art

Single-wire bidirectional data communication may have a configuration of transmitting a command from a master side to a slave side through a single communication line and sending back a command response from the slave side to the master side.

Such a system configuration may be used for quality testing at the time of product shipment such as, for example, transmitting a command from a test device corresponding to a master side to a product corresponding to a slave side, and receiving, at the master side, a response sent back from the slave side to check the quality of the product.

As conventional single-wire bidirectional communication techniques, there are proposed, for example, a communication technique which uses A/D and D/A conversion (Japanese Laid-open Patent Publication No. 2011-55312), or a communication technique which fixes a logic level via time clocking (U.S. Pat. No. 5,210,846). In addition, there is proposed a technique in which a first device transmits a clock to a second device by switching between a first level and an intermediate level, and the second device transmits, to the first device, information as to whether or not to output a second level during a period of the intermediate level of the clock (Japanese Laid-open Patent Publication No. 2012-169746).

On the other hand, there is proposed, as a conventional technique corresponding to a slave side of bidirectional communication, a technique which measures a sensor output by gradually changing trimming data, for example, fixes and stores trimming data for setting the sensor output to a desired value, and adjusts the sensor output with the stored trimming data (Japanese Laid-open Patent Publication No. 2002-310735).

With the conventional single-wire bidirectional data communication system, it has been difficult to reduce the circuit scale. The circuit scale turns out to increase due to, for example, a built-in A/D and D/A converter according to the aforementioned Japanese Laid-open Patent Publication No. 2011-55312, or addition of a timer circuit or the like for time clocking according to the U.S. Pat. No. 5,210,846.

As thus described, there has been a defect that, when realizing bidirectional communication conventionally such as writing data from the master side to the slave side or reading slave-side data from the master side, communication apparatuses at the master side and the slave side have a complicated circuit configuration, resulting in an increased circuit scale.

SUMMARY OF THE INVENTION

According to an aspect of the present disclosure, there is provided a data communication system including a master-side data communication apparatus configured to perform bidirectional communication with a slave side via a single-wire communication line; and a slave-side data communication apparatus configured to perform bidirectional communication with the master-side data communication apparatus via the communication line, wherein the master-side data communication apparatus includes: an input clock-side transistor connected between a reference potential and the communication line, and configured to perform switching according to an input clock; a first transistor connected between a first potential and the communication line; a second transistor having one end connected to a second potential lower than the first potential; a third transistor having one end connected to the second potential; a master-side resistor connected between the other end of the second transistor and the other end of the third transistor; a connection breaking circuit configured to break an electrical connection between the second and third transistors and the communication line, according to a switching state of the first transistor; and a master-side data reproduction circuit configured to reproduce data transmitted from the slave-side data communication apparatus via the communication line, and wherein the slave-side data communication apparatus includes: a fourth transistor connected between the communication line and a third potential equal to or higher than the first potential; a slave-side resistor connected between the communication line and the reference potential; a clock reproduction circuit configured to reproduce a clock transmitted from the master-side data communication apparatus via the communication line; and a slave-side data reproduction circuit configured to reproduce data transmitted from the master-side data communication apparatus via the communication line.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 19 illustrates exemplary functions of a 3-bit command register;

FIG. 21 is an explanatory diagram illustrating each state;

DETAILED DESCRIPTION OF THE INVENTION

Figure 1:
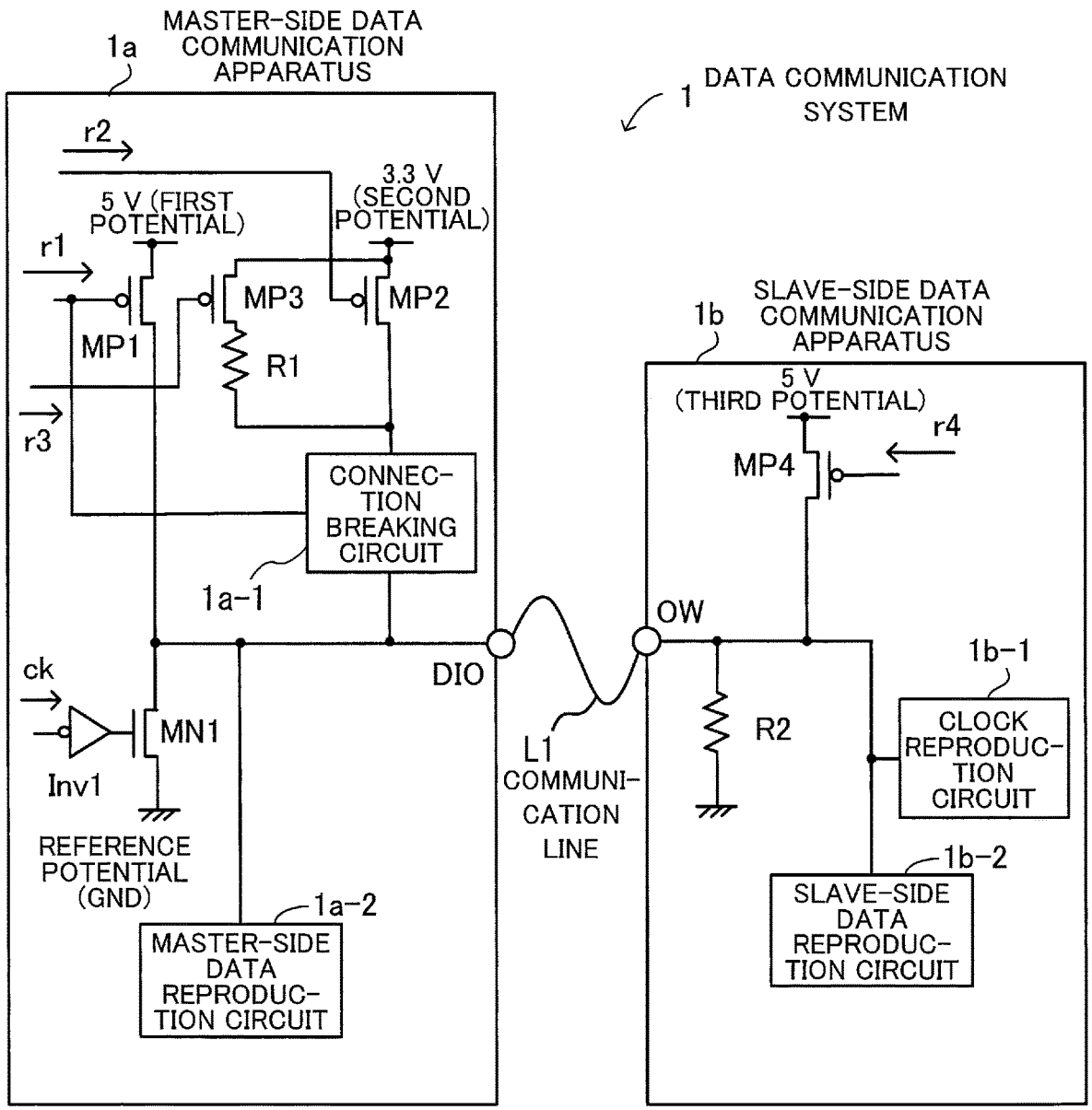
FIG. 1 illustrates an exemplary configuration of a data communication system.

In the following, embodiments will be described, referring to the drawings. FIG. 1 illustrates an exemplary configuration of a data communication system. A data communication system 1 includes a master-side data communication apparatus 1a and a slave-side data communication apparatus 1b.

In addition, a terminal DIO of the master-side data communication apparatus 1a and a terminal OW of the slave-side data communication apparatus 1b are connected by a single-wire communication line L1, and bidirectional communication is performed between the master-side data communication apparatus 1a and the slave-side data communication apparatus 1b via the communication line L1.

The Master-side data communication apparatus 1a includes an NMOS (N channel Metal Oxide Semiconductor) transistor MN1, PMOS (P channel MOS) transistors MP1 to MP3, a resistor R1 (master-side resistor), an inverter Inv1, a connection breaking circuit 1a-1, and a master-side data reproduction circuit 1a-2.

Note that the NMOS transistor MN1 corresponds to an input clock-side transistor, and the PMOS transistors MP1 to MP3 correspond to first to third transistors, respectively.

The NMOS transistor MN1, connected between a reference potential (GND) and the communication line L1, performs switching according to a clock ck.

The PMOS transistor MP1 is connected between 5 V (first potential) and the communication line L1. The PMOS transistor MP2 has one end (source) connected to 3.3 V (second potential lower than the first potential). The PMOS transistor MP3 has one end (source) connected to 3.3 V.

The resistor R1 is connected between the other end (drain) of the PMOS transistor MP2 and the other end (drain) of the PMOS transistor MP3.

The connection breaking circuit 1a-1 breaks the electrical connection between the PMOS transistors MP2 and MP3 and the communication line L1 according to the switching state of the PMOS transistor MP1.

The master-side data reproduction circuit 1a-2 reproduces data transmitted from the slave-side data communication apparatus 1b via the communication line L1.

On the other hand, the slave-side data communication apparatus 1b includes a PMOS transistor MP4, a resistor R2 (slave-side resistor), a clock reproduction circuit 1b-1, and a slave-side data reproduction circuit 1b-2. The PMOS transistor MP4 corresponds to a fourth transistor.

Note that the PMOS transistor MP4 is connected between 5 V (third potential) and the communication line L1. The third potential supplied to the slave-side data communication apparatus 1b, being equal to or higher than the first potential of the master-side data communication apparatus 1a, is illustrated here as an example which is equal to the first potential (5 V).

The resistor R2 is connected between the communication line L1 and a GND. The clock reproduction circuit 1b-1 reproduces and outputs a clock transmitted from the master-side data communication apparatus 1a via the communication line L1.

The slave-side data reproduction circuit 1b-2 reproduces and outputs data transmitted from the master-side data communication apparatus 1a via the communication line L1.

Here, the NMOS transistor MN1 turns on when a clock ck to be input to the inverter Inv1 is at a low potential level (L level), to set the potential on the communication line L1 to GND.

When writing data from the master side to the slave side, the PMOS transistor MP1 is turned on by a first condition signal r1 which is set to the L level when data, a master-side enable signal, and the clock ck are set to a high potential level (H level), to set the potential on the communication line L1 to 5 V.

When writing the data from the master side to the slave side, the PMOS transistor MP2 is turned on by a second condition signal r2 which is set to the L level when data is set to the L level and the master-side enable signal and the clock ck are set to the H level, to set the potential on the communication line L1 to 3.3 V.

When reading the slave-side data from the master side, the PMOS transistor MP3 is turned on by a third condition signal r3 which is set to the L level when the master-side enable signal is set to the L level, to set the communication line L1 to a pull-up state of 3.3 V via the resistor R1.

When reading data transmitted from the slave side at the master side, the PMOS transistor MP4 is turned on by a fourth condition signal r4 which is set to the L level when data, the slave-side enable signal, and the clock reproduced by the clock reproduction circuit 1b-1 are set to the H level, to set the potential on the communication line L1 to 5 V.

According to the aforementioned configuration of the data communication system 1, it becomes possible to efficiently write data from the master side to the slave side or read the slave-side data from the master side via the single-wire communication line L1, and also reduce the circuit scale.

Figure 2:
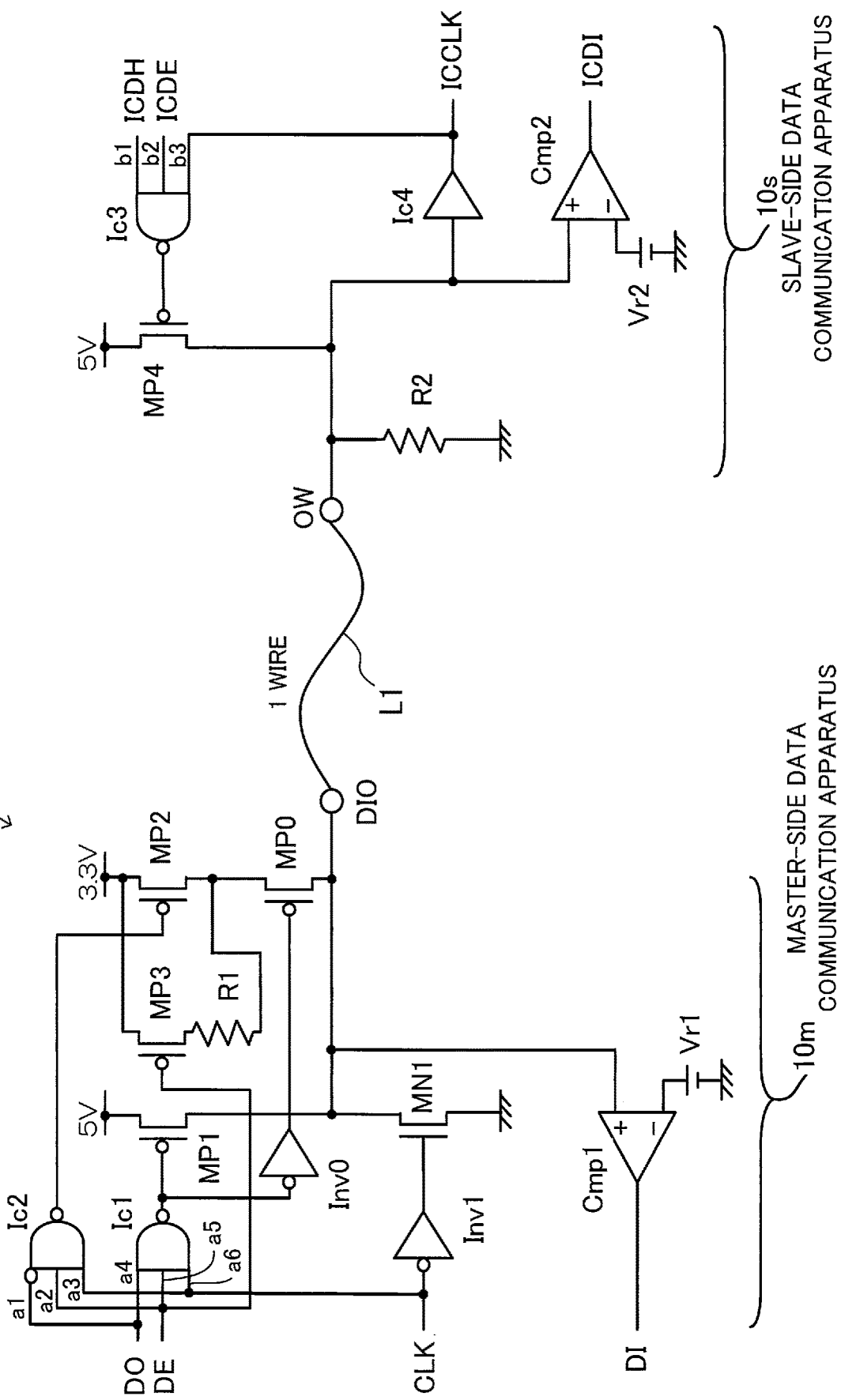
FIG. 2 illustrates an exemplary configuration of the data communication system.

Next, a specific exemplary configuration of the data communication system 1 will be described. FIG. 2 illustrates an exemplary configuration of the data communication system. A data communication system 1-1 includes a master-side data communication apparatus 10m and a slave-side data communication apparatus 10s, the master-side data communication apparatus 10m and the slave-side data communication apparatus 10s being connected to each other via the single communication line L1.

The master-side data communication apparatus 10m is operated by a plurality of power supplies, such as a 5-V and a 3.3-V operating power supplies illustrated in the example of FIG. 2. The slave-side data communication apparatus 10s is operated by a single power supply, such as a single 5-V operating power supply (which may be higher than 5 V) in the example of FIG. 2. In addition, the GND is common to the master-side data communication apparatus 10m and the slave-side data communication apparatus 10s.

The master-side data communication apparatus 10m corresponds to a test device (tester) that tests the slave-side data communication apparatus 10s, for example, whereas the slave-side data communication apparatus 10s corresponds to a product (e.g., an IC (Integrated Circuit)) to be tested by the master-side data communication apparatus 10m.

Note that both the master-side data communication apparatus 10m and the slave-side data communication apparatus 10s are communication interface circuits including a control circuit at an upper level thereof to perform such a test function or the like (described below referring to FIGS. 10 to 13).

The master-side data communication apparatus 10m includes a terminal DO, a terminal DE, a terminal CLK, a terminal DI, and a terminal DIO. The terminals DO, DE, CLK and DI are internal terminals, whereas the terminal DIO is an external terminal. The terminal DO is a terminal to which data to be transmitted from the master side to the slave side (command for a test, data to be written, and the like) is input, and the terminal DE is a terminal to which a master-side enable signal is input. The terminal CLK is a terminal to which a clock is input.

The terminal DI is a terminal from which data transmitted from the slave-side data communication apparatus 10s is output, or a terminal from which data transmitted by the master-side data communication apparatus 10m is fed back and output.

The terminal DIO is an input/output interface terminal connected to one end of the communication line L1 to communicate with the slave-side data communication apparatus 10s.

In addition, the master-side data communication apparatus 10m includes, as components, logical elements Ic1 and Ic2, inverters Inv0 and Inv1, the resistor R1, the NMOS transistor MN1, PMOS transistors MP0 to MP3, a comparator Cmp1, and a reference voltage source Vr1.

Note that the comparator Cmp1 and the reference voltage source Vr1 realize the function of the master-side data reproduction circuit 1a-2 of FIG. 1, and the inverter Inv0 and the PMOS transistor MP0 realize the function of the connection breaking circuit 1a-1 of FIG. 1 (the connection breaking circuit 1a-1 will be described below, referring to FIGS. 6 to 8).

The logical element Ic1 is a three-input/one-output logical operation circuit whose output (the output corresponds to the first condition signal r1) is set to the L level when an input condition that three inputs to input ends a4 to a6 are at the H level is satisfied, and is set to the H level when an input condition other than the foregoing is satisfied.

In addition, the logical element Ic2 is a three-input/one-output logical operation circuit whose output (the output corresponds to the second condition signal r2) is set to the L level when an input condition that one input to an input end a1 is at the L level and two inputs to input ends a2 and a3 are at the H level is satisfied, and is set to the H level when an input condition other than the foregoing is satisfied. Note that the enable signal input from the terminal DE corresponds to the third condition signal r3.

With regard to the connection relation of respective elements in the master-side data communication apparatus 10m, the terminal DO is connected to the input end a1 of the logical element Ic2 and the input end a4 of the logical element Ic1. The terminal DE is connected to the input end a2 of the logical element Ic2, the input end a5 of the logical element Ic1, and the gate of the PMOS transistor MP3.

The terminal CLK is connected to the input end a3 of the logical element Ic2, the input end a6 of the logical element Ic1, and the input end of the inverter Inv1. The terminal DI is connected to the output end of the comparator Cmp1.

The output end of the logical element Ic2 is connected to the gate of the PMOS transistor MP2, and the output end of the logical element Ic1 is connected to the gate of the PMOS transistor MP1 and the input end of the inverter Inv0.

The source of the PMOS transistor MP1 is connected to the 5-V power supply. The drain of the PMOS transistor MP1 is connected to the drain of the NMOS transistor MN1, the positive input end of the comparator Cmp1, the drain of the PMOS transistor MP0, and the terminal DIO.

The gate of the NMOS transistor MN1 is connected to the output end of the inverter Inv1, and the source of the NMOS transistor MN1 is connected to the GND. The negative input end of the comparator Cmp1 is connected to the positive terminal of the reference voltage source Vr1, and the negative terminal of the reference voltage source Vr1 is connected to the GND.

The source of the PMOS transistor MP3 is connected to the 3.3-V power supply and the source of the PMOS transistor MP2, and the drain of the PMOS transistor MP3 is connected to one end of the resistor R1.

The drain of the PMOS transistor MP2 is connected to the other end of the resistor R1 and the source of the PMOS transistor MP0, and the gate of the PMOS transistor MP0 is connected to the output end of the inverter Inv0.

Here, the reference voltage source Vr1 connected to the negative input end of the comparator Cmp1 is supposed to generate an intermediate potential (4.2 V) between 5 V (first potential) and 3.3 V (second potential).

Therefore, a signal at the H level (5 V) is output from the comparator Cmp1 when the level of an input signal to the positive input end of the comparator Cmp1 is equal to or higher than 4.2 V. Alternatively, a signal at the L level (GND) is output when the level of the input signal to the positive input end of the comparator Cmp1 is lower than 4.2 V.

On the other hand, the slave-side data communication apparatus 10s includes a terminal ICDH, a terminal ICDE, a terminal ICCLK, a terminal ICDI, and a terminal OW (one wire). The terminals ICDH, ICDE, ICCLK and ICDI are internal terminals, whereas the terminal OW is an external terminal. The terminal ICDH is a terminal to which data to be transmitted from the slave side to the master side (responses to commands, or the like) is input, and the terminal ICDE is a terminal to which a slave-side enable signal is input.

The terminal ICCLK is a terminal from which a reproduced clock is output. The terminal ICDI is a terminal from which data transmitted from the master-side data communication apparatus 10m is output, or a terminal from which data transmitted by the slave-side data communication apparatus 10s is fed back and output. The terminal OW is an input/output interface terminal connected to the other end of the communication line L1 to communicate with the master-side data communication apparatus 10m.

In addition, the slave-side data communication apparatus 10s includes a logical element Ic3, a buffer Ic4, a resistor R2, the PMOS transistor MP4, a comparator Cmp2, and a reference voltage source Vr2 as components.

Note that the comparator Cmp2 and the reference voltage source Vr2 realize the function of the slave-side data reproduction circuit 1b-2 of FIG. 1, and the buffer Ic4 realizes the function of the clock reproduction circuit 1b-1 of FIG. 1.

The logical element Ic3 is a three-input/one-output logical operation circuit whose output is set to the L level when an input condition that three inputs to input ends b1 to b3 are at the H level (the output corresponds to the fourth condition signal r4) is satisfied, or is set to the H level when an input condition other than the foregoing is satisfied.

In addition, the relation between respective resistor values of the resistor R1 provided in the master-side data communication apparatus 10m and the resistor R2 provided in the slave-side data communication apparatus 10s is R1<<R2.

With regard to the connection relation of respective elements in the slave-side data communication apparatus 10s, the terminal ICDH is connected to the input end b1 of the logical element Ic3, and the terminal ICDE is connected to the input end b2 of the logical element Ic3. The terminal ICCLK is connected to the input end b3 of the logical element Ic3 and the output end of the buffer Ic4. The terminal ICDI is connected to the output end of the comparator Cmp2.

The gate of the PMOS transistor MP4 is connected to the output end of the logical element Ic3, and the source of the PMOS transistor MP4 is connected to the 5-V power supply. The drain of the PMOS transistor MP4 is connected to the terminal OW, one end of the resistor R2, the input end of the buffer Ic4, and the positive input end of the comparator Cmp2.

The other end of the resistor R2 is connected to the GND, the negative input end of the comparator Cmp2 is connected to the positive terminal of the reference voltage source Vr2, and the negative terminal of the reference voltage source Vr2 is connected to the GND.

Here, the reference voltage source Vr2 connected to the negative input end of the comparator Cmp2 is supposed to generate an intermediate potential ($\approx$4.2 V) between 5 V (third potential) and 3.3 V (second potential).

Therefore, a signal at the H level (5 V) is output from the comparator Cmp2 when the level of an input signal to the positive input end of the comparator Cmp2 is equal to or higher than 4.2 V of the reference voltage. Alternatively, a signal at the L level (the GND) is output when the level of the input signal to the positive input end of the comparator Cmp2 is lower than 4.2 V of the reference voltage.

Figure 3:
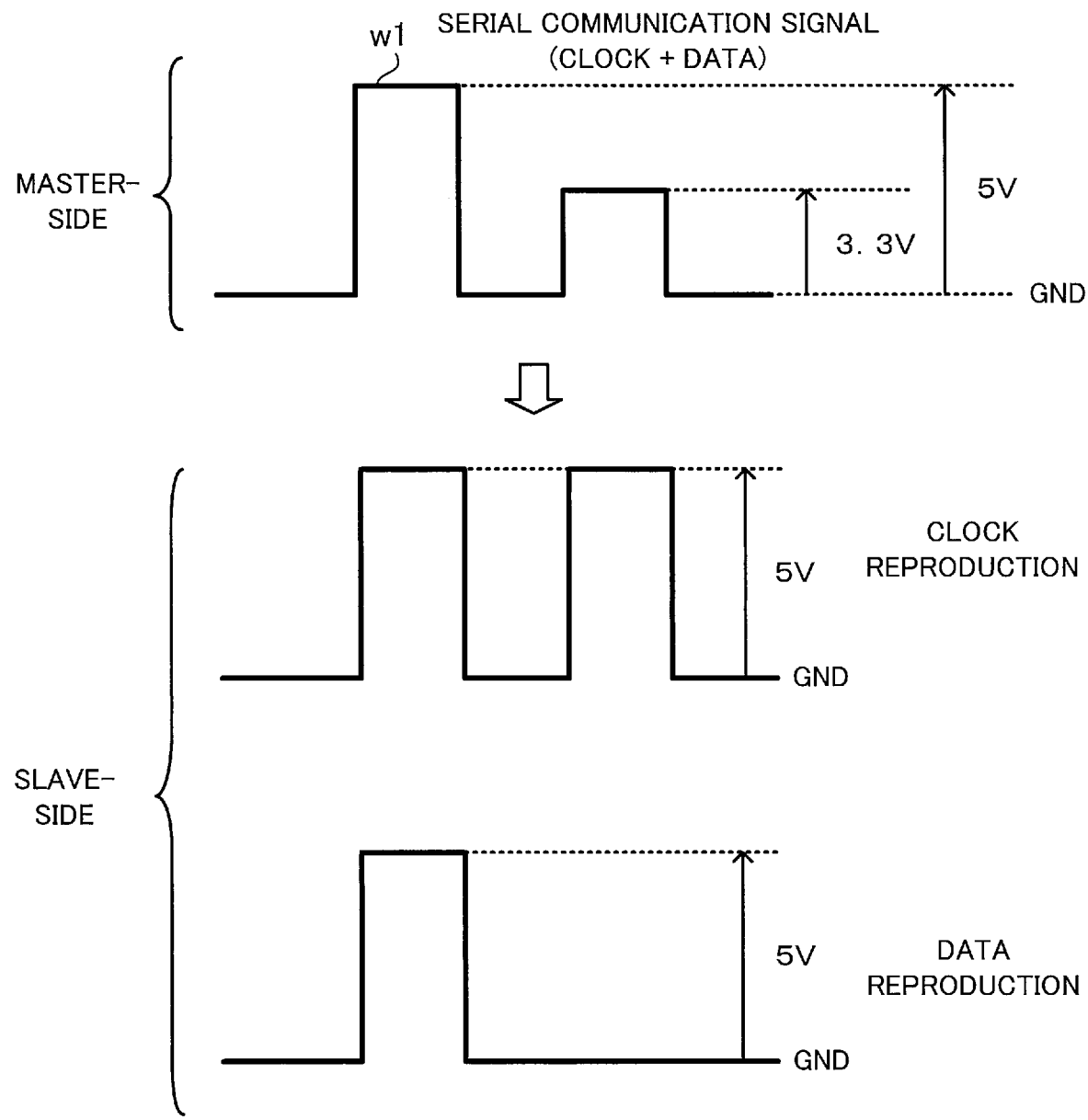
FIG. 3 illustrates a waveform of a transmission signal.

Next, the waveform of the transmission signal on the communication line L1 of the data communication system 1-1 will be described. FIG. 3 illustrates the waveform of the transmission signal. The master-side data communication apparatus 10m generates, and transmits through the communication line L1, a serial communication signal w1 obtained by combining a clock and data. The serial communication signal w1 has three levels: 5 V, 3.3 V, and the GND level.

Upon receiving the serial communication signal w1 transmitted from the master-side data communication apparatus 10m, the slave-side data communication apparatus 10s reproduces the clock and data.

In such a case, the H level of the clock is reproduced from the 5-V level or the 3.3-V level of the serial communication signal w1, and the L level of the clock corresponds to the GND of the serial communication signal w1.

In addition, the H level of the data is reproduced from the 5-V level of the serial communication signal w1, and the L level of the data corresponds to the 3.3-V level of the serial communication signal w1 or the GND level.

Next, the operation in the write mode in which the master-side data communication apparatus 10m writes data to the slave-side data communication apparatus 10s will be described, referring to FIGS. 2 and 4.

Figure 4:
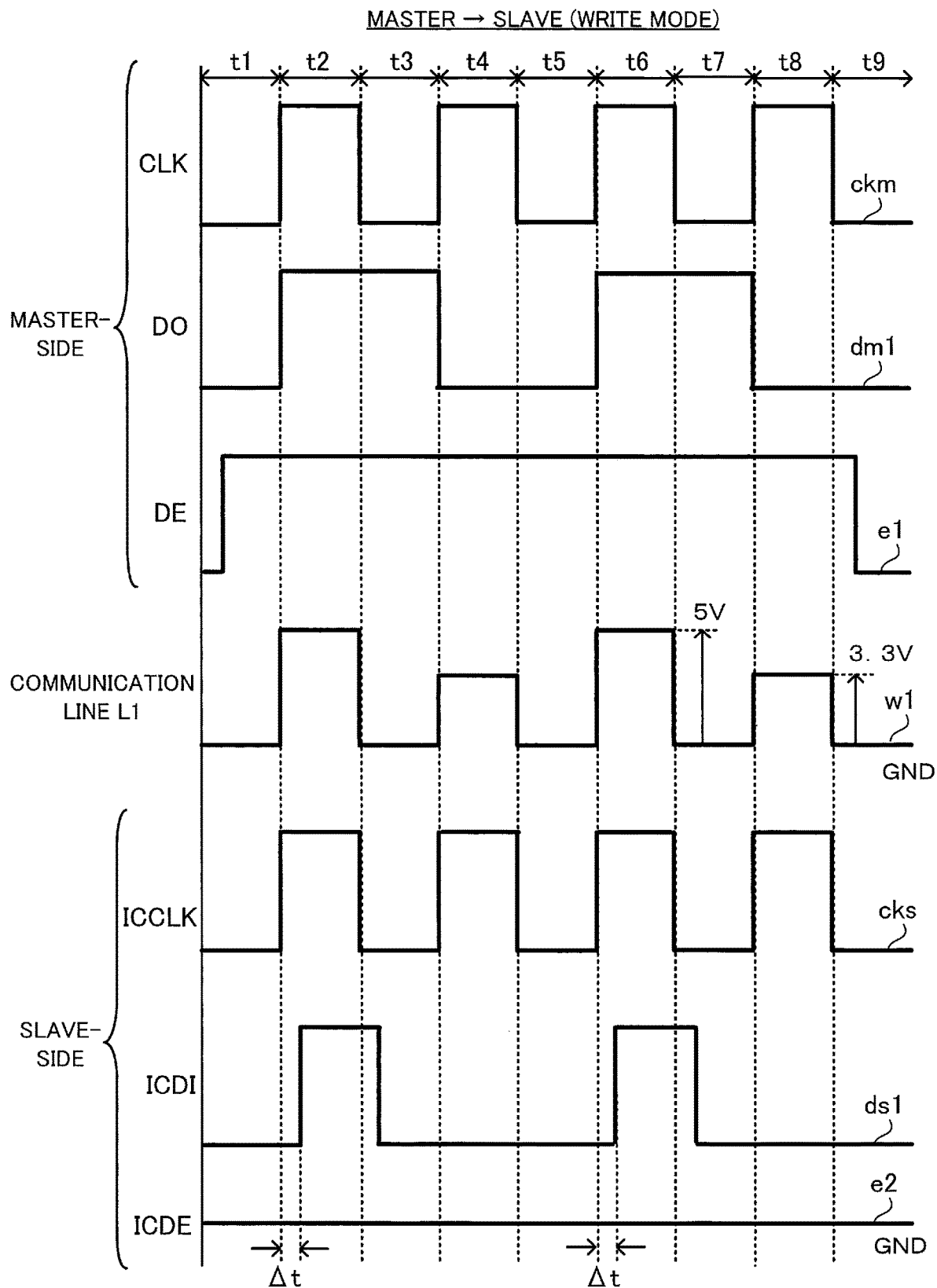
FIG. 4 illustrates an operation waveform of a write mode.

FIG. 4 illustrates an operation waveform in the write mode. In the waveform of FIG. 4, a clock input to the terminal CLK is denoted by a clock ckm, data input to the terminal DO is denoted by data dm1, and a master-side enable signal input to the terminal DE is denoted by an enable signal e1.

In addition, a reproduced clock output from the terminal ICCLK is denoted by a clock cks, reproduced data output from the terminal ICDI is denoted by data ds1, and a slave-side enable signal input to the terminal ICDE is denoted by an enable signal e2.

Note that, in the write mode from the master side to the slave side, the master-side enable signal e1 turns to the H level, and the slave-side enable signal e2 turns to the L level.

(Time zones t1, t3, t5, t7, t9) In the master-side data communication apparatus 10m, the NMOS transistor MN1 turns on when the clock ckm is at the L level. Accordingly, the terminal DIO connects to the GND level, and therefore the serial communication signal w1 flowing through the communication line L1 turns to the GND level, regardless of the level of the data dm1 to be transmitted.

In the slave-side data communication apparatus 10s, on the other hand, the terminal OW turns to the GND level, whereby the input of the buffer Ic4 turns to the GND level, and the clock cks output from the buffer Ic4, turns to the L level (GND).

Note that the buffer Ic4 is a CMOS (Complementary MOS) element, with an operation threshold voltage about 2.5 V. Therefore, inputting a voltage lower than 2.5 V turns the output level of the buffer Ic4 to the GND level.

On the other hand, the positive input end of the comparator Cmp2 turns to the GND level, which is lower than 4.2 V of the reference voltage at the negative input end, and therefore the comparator Cmp2 outputs the data ds1 at the L level.

(Time zones t2, t6) In the master-side data communication apparatus 10m, the clock ckm, the data dm1, and the enable signal e1 have turned to the H level, and the enable signal e2 of the slave-side data communication apparatus 10s has turned to the L level.

On this occasion, the switching states of the NMOS transistor MN1 and the PMOS transistors MP0 and MP4 in the system respectively turn out to be (MN1, MP0, MP1, MP2, MP3, MP4)=(OFF, OFF, ON, OFF, OFF, OFF). Accordingly, the terminal DIO connects to the 5-V power supply, and therefore the serial communication signal w1 turns to the 5-V level.

In the slave-side data communication apparatus 10s, on the other hand, the terminal OW turns to 5 V, and therefore the input of the buffer Ic4 turns to 5 V, and the clock cks output from the buffer Ic4 turns to the H level (5 V).

Note that the operation threshold voltage of the buffer Ic4 is about 2.5 V, and therefore inputting a voltage exceeding 2.5 V turns the output level of the buffer Ic4 to 5 V of the operating power supply.

On the other hand, the positive input end of the comparator Cmp2 has turned to 5 V, which is higher than 4.2 V of the reference voltage of the negative input end, and therefore the comparator Cmp2 outputs the data ds1 at the H level. FIG. 4 illustrates that the H level is output after a transmission delay time $\Delta t$.

(Time zones t4, t8) In the master-side data communication apparatus 10m, the clock ckm has turned to the H level, the data dm1 has turned to the L level, the enable signal e1 has turned to the H level, and the enable signal e2 of the slave-side data communication apparatus 10s has turned to the L level.

On this occasion, the switching states of the NMOS transistor MN1 and the PMOS transistors MP0 to MP4 in the system respectively turn out to be (MN1, MP0, MP1, MP2, MP3, MP4)=(OFF, ON, OFF, ON, OFF, OFF). Accordingly, the 3.3-V power supply connects to the terminal DIO, and therefore the serial communication signal w1 turns to the 3.3-V level.

In the slave-side data communication apparatus 10s, on the other hand, the terminal OW turns to 3.3 V, and therefore the input of the buffer Ic4 turns to 3.3 V, and the clock cks output from the buffer Ic4 turns to the H level (5 V).

Note that the operation threshold voltage of the buffer Ic4 is about 2.5 V, and therefore inputting a voltage exceeding 2.5 V as described above turns the output level of the buffer Ic4 to 5 V of the operating power supply.

On the other hand, the positive input end of the comparator Cmp2 has turned to 3.3 V, which is lower than 4.2 V of the reference voltage at the negative input end, and therefore the comparator Cmp2 outputs the data ds1 at the L level.

As thus described, it may be seen that, in the write mode from the master to the slave, the master-side clock is reproduced at the slave side, and the H level of the master-side data has been written to the slave side approximately in the time zones t2, t6.

Next, the operation in the read mode in which the master-side data communication apparatus 10m reads data to be transmitted from the slave-side data communication apparatus 10s will be described, referring to FIGS. 2 and 5.

Figure 5:
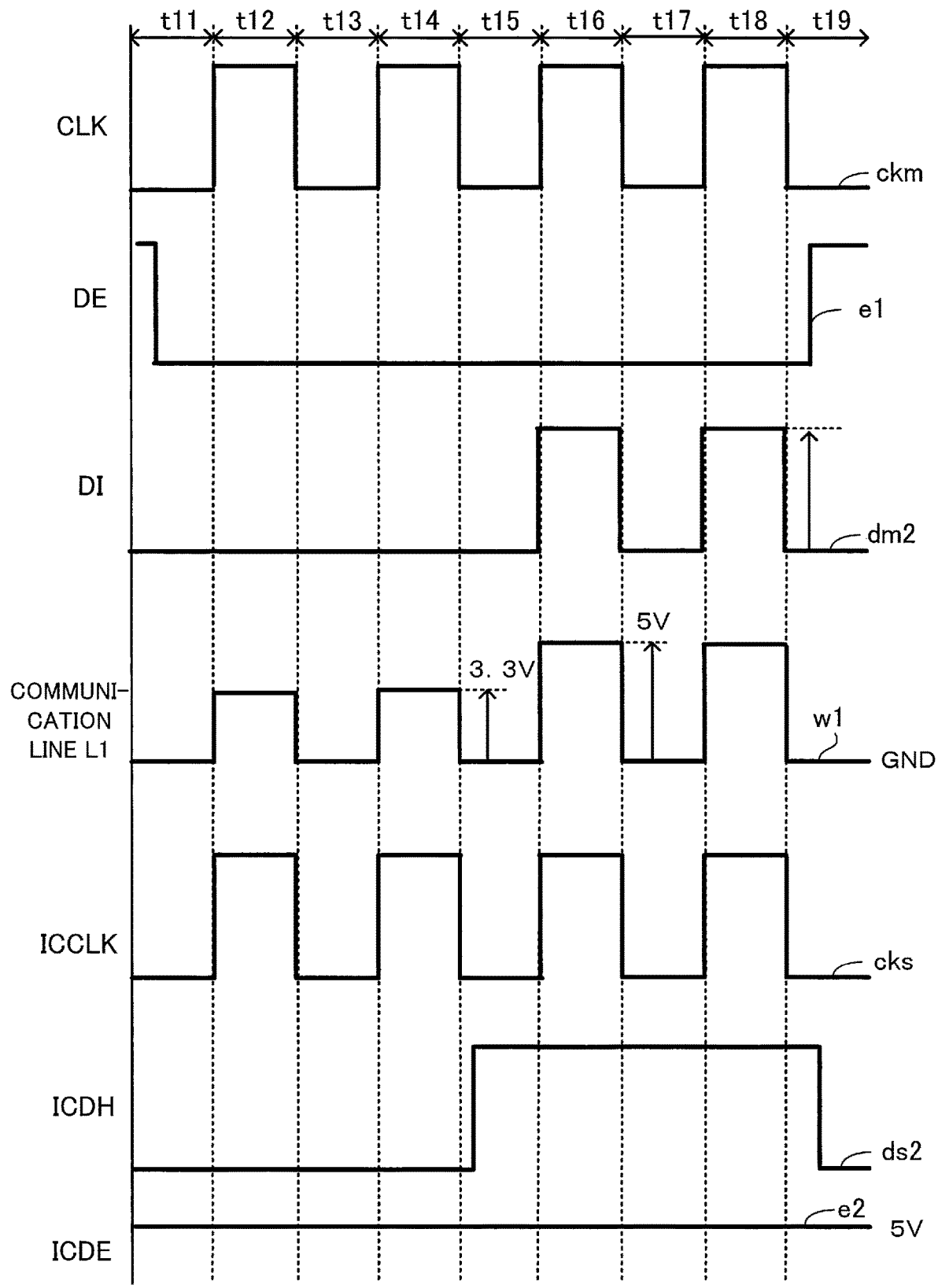
FIG. 5 illustrates an operation waveform of a read mode.

FIG. 5 illustrates an operation waveform in the read mode. The difference from the waveform illustrated in FIG. 4 lies in that the data output from the terminal DI is denoted by data dm2, and the data input to the terminal ICDH is denoted by data ds2. The data dm1 input from the terminal DO is "don't care" (may be either the H level or the L level) and therefore not illustrated.

Note that, in the read mode from the master side to the slave side, the master-side enable signal e1 turns to the L level, and the slave-side enable signal e2 turns to the H level.

(Time zones t11, t13, t15, t17, t19) In the master-side data communication apparatus 10m, the NMOS transistor MN1 turns on when the clock ckm is at the L level. Accordingly, the terminal DIO connects to the GND and therefore the serial communication signal w1 turns to the GND level.

In the slave-side data communication apparatus 10s, on the other hand, the terminal OW turns to the GND level, whereby the input of the buffer Ic4 turns to the GND level, which is lower than the operation threshold voltage of the buffer Ic4, and therefore the clock cks output from the buffer Ic4 turns to the L level.

Additionally, in the master-side data communication apparatus 10m, the positive input end of the comparator Cmp1 turns to the GND level, which is lower than 4.2 V of the reference voltage at the negative input end, and therefore the comparator Cmp1 outputs the data dm2 at the L level.

(Time zones t12, t14) In the master-side data communication apparatus 10m, the clock ckm has turned to the H level and the enable signal e1 has turned to the L level, whereas in the slave-side data communication apparatus 10s, the data ds2 has turned to the L level and the enable signal e2 has turned to the H level.

On this occasion, the switching states of the NMOS transistor MN1 and the PMOS transistors MP0 to MP4 in the system respectively turn out to be (MN1, MP0, MP1, MP2, MP3, MP4)=(OFF, ON, OFF, OFF, ON, OFF). Accordingly, the terminal OW turns to 3.3 V of the pull-up state via the resistor R1 and therefore the serial communication signal w1 turns to the 3.3-V level.

In the slave-side data communication apparatus 10s, on the other hand, the input of the buffer Ic4 turns to 3.3 V, which is higher than the operation threshold voltage of the buffer Ic4, and therefore the clock cks turns to the 5-V level.

Additionally, in the master-side data communication apparatus 10m, the positive input end of the comparator Cmp1 turns to 3.3 V, which is lower than 4.2 V of the reference voltage at the negative input end, and therefore the comparator Cmp1 outputs the data dm2 at the L level.

(Time zones t16, t18) In the master-side data communication apparatus 10m, the clock ckm has turned to the H level and the enable signal e1 has turned to the L level, whereas in the slave-side data communication apparatus 10s, data ds2 has turned to the H level and the enable signal e2 has turned to the H level.

On this occasion, the switching states of the NMOS transistor MN1 and the PMOS transistors MP0 to MP3 at the master side respectively turn out to be (MN1, MP0, MP1, MP2, MP3)=(OFF, ON, OFF, OFF, ON).

In the slave-side data communication apparatus 10s, on the other hand, the input voltage of the buffer Ic4 is higher than the operation threshold voltage of the buffer Ic4 on this occasion, whereby the clock cks turns to the 5-V level. Accordingly, the switching state of the PMOS transistor MP4 at the slave side turns on, whereby the terminal OW connects to the 5-V power supply at the slave side and therefore the serial communication signal w1 turns to the 5-V level.

Additionally, in the master-side data communication apparatus 10m, the positive input end of the comparator Cmp1 turns to 5 V, which is higher than 4.2 V of the reference voltage at the negative input end, and therefore the comparator Cmp1 outputs the data dm2 at the H level.

As thus described, it may be seen that the master-side clock is reproduced at the slave side in the read mode from the master to the slave, and also the H level of the slave-side data is read at the master side in the time zones t16, t18.

Next, a leak current suppression function of the master side in the connection breaking circuit 1a-1 will be described. The master-side data communication apparatus 10m of the data communication system 1-1 has a circuit configuration for controlling the leak current that may flow from the PMOS transistors MP2 and MP3.

First, the circuit configuration that may cause leak current will be described. FIG. 6 illustrates the circuit configuration that may cause leak current. The data communication system 100 has a master-side data communication apparatus 100m and the slave-side data communication apparatus 10s.

The master-side data communication apparatus 100m is configured not to include the inverter Inv0 and the PMOS transistor MP0 illustrated in FIG. 2. Accordingly, the drain of the PMOS transistor MP2 and the other end of the resistor R1 are directly connected to the terminal DIO. The other components are the same as those in FIG. 2.

Figure 6:
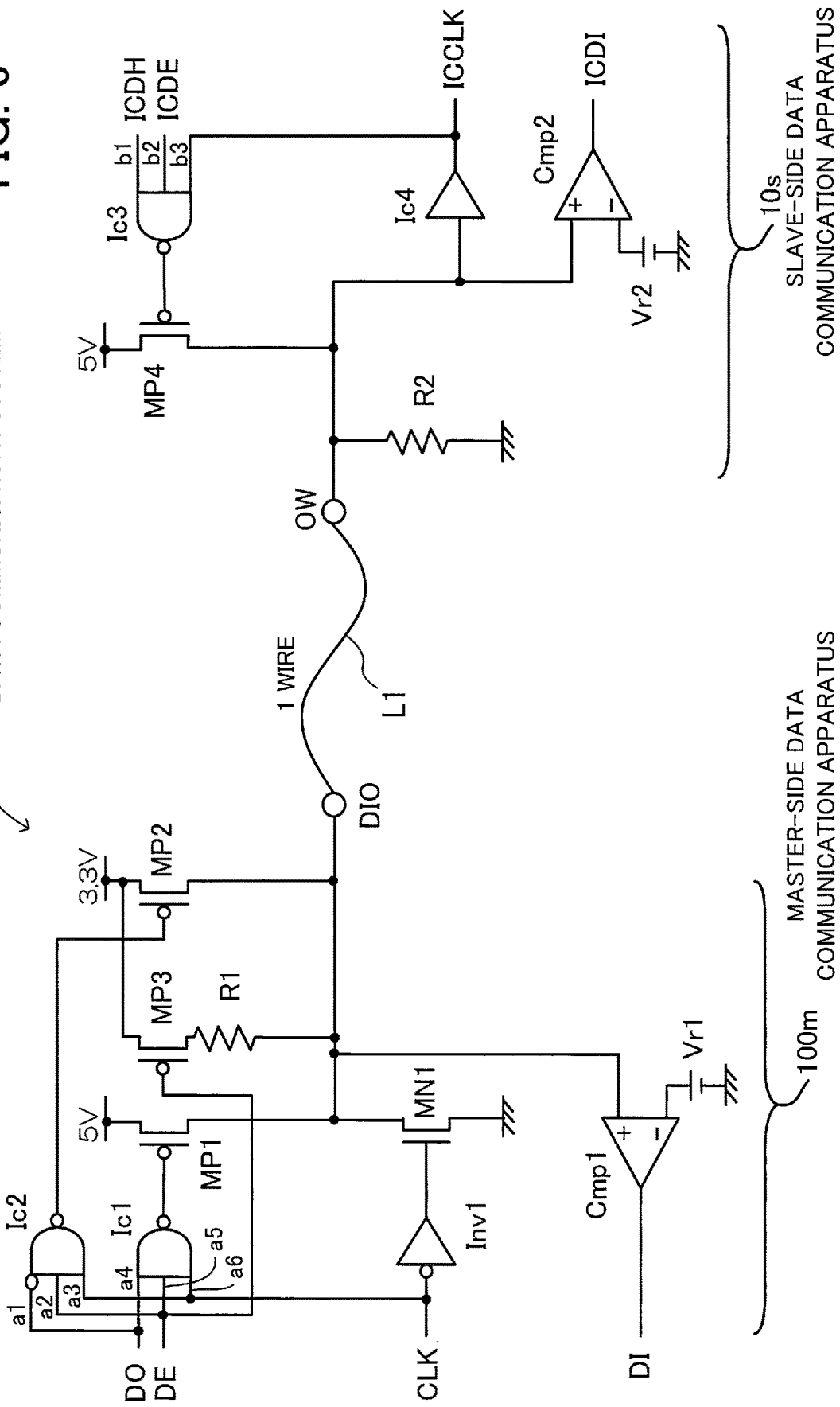
FIG. 6 illustrates a circuit configuration in which leak current occurs.

The configuration of the master-side data communication apparatus 100m as illustrated in FIG. 6 may cause a problem of occurrence of leak current due to the PMOS transistors MP2 and MP3.

Figure 7:
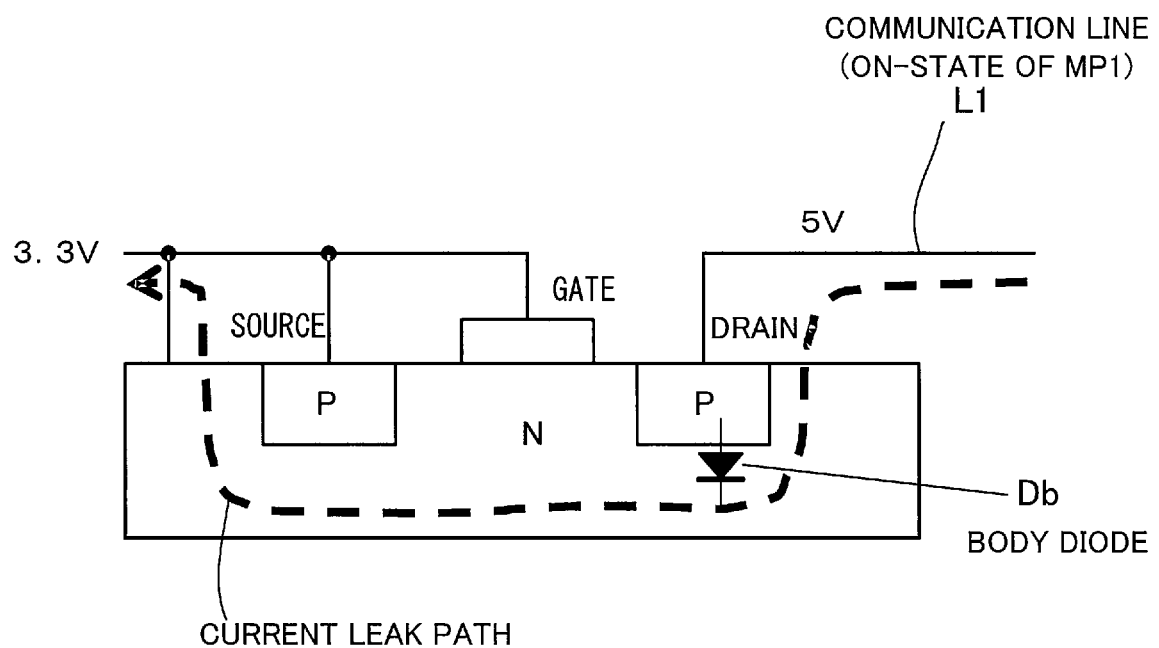
FIG. 7 is an explanatory diagram illustrating a cause of leak current occurrence.

FIG. 7 is an explanatory diagram illustrating the cause of occurrence of leak current. There is illustrated a cross-sectional structure of the PMOS transistors MP2 and MP3.

An operation is performed to turn the communication line L1 to 5 V when the PMOS transistor MP1 is in an on-state. On this occasion, a drain-side potential of the PMOS transistor MP2 becomes higher than 3.3 V, with the configuration of the master-side data communication apparatus 100m of FIG. 6. Similarly, a drain-side potential of the PMOS transistor MP3 also becomes higher than 3.3 V via the resistor R1.

Accordingly, current (leak current) flows in the arrow direction as illustrated in FIG. 7 through body diodes (parasitic diodes) Db of the PMOS transistors MP2 and MP3, which may result in a defect that the signal voltage of the communication line L1 does not reach 5 V.

In order to improve such a defect, the master-side data communication apparatus 10m illustrated in FIG. 2 has added thereto the inverter Inv0 and the PMOS transistor MP0 as the connection breaking circuit 1a-1.

In FIG. 2, the gate of the PMOS transistor MP1 is connected to the input of the inverter Inv0, and the output of the inverter Inv0 is connected to the gate of the PMOS transistor MP0. In addition, the source of the PMOS transistor MP0 is connected to the drain of the PMOS transistor MP2 and the other end of the resistor R1.

The drain of the PMOS transistor MP0 is connected to the terminal DIO, the drain of the PMOS transistor MP1, the drain of the NMOS transistor MN1, and the positive input end of the comparator Cmp1.

The aforementioned configuration brings the PMOS transistor MP0 into an off-state when the PMOS transistor MP1 is in an on-state, whereby the electrical connection between the communication line L1 and the PMOS transistors MP2 and MP3 is broken (becomes high impedance).

As a result, the body diodes Db of the PMOS transistors MP2 and MP3 do not turn on when the communication line L1 is at 5 V and therefore the communication line L1 turns out to be normally maintained at 5 V without occurrence of leak current (however, the back gate voltage of the PMOS transistor MP0 is assumed to be 5 V).

Next, a variation of a configuration having a leak current suppression function will be described. Although, in the foregoing description, occurrence of leak current is suppressed by use of the inverter Inv0 and the PMOS transistor MP0, an equivalent effect may be obtained using a diode. The variation indicates a case of a circuit configuration using a diode.

Figure 8:
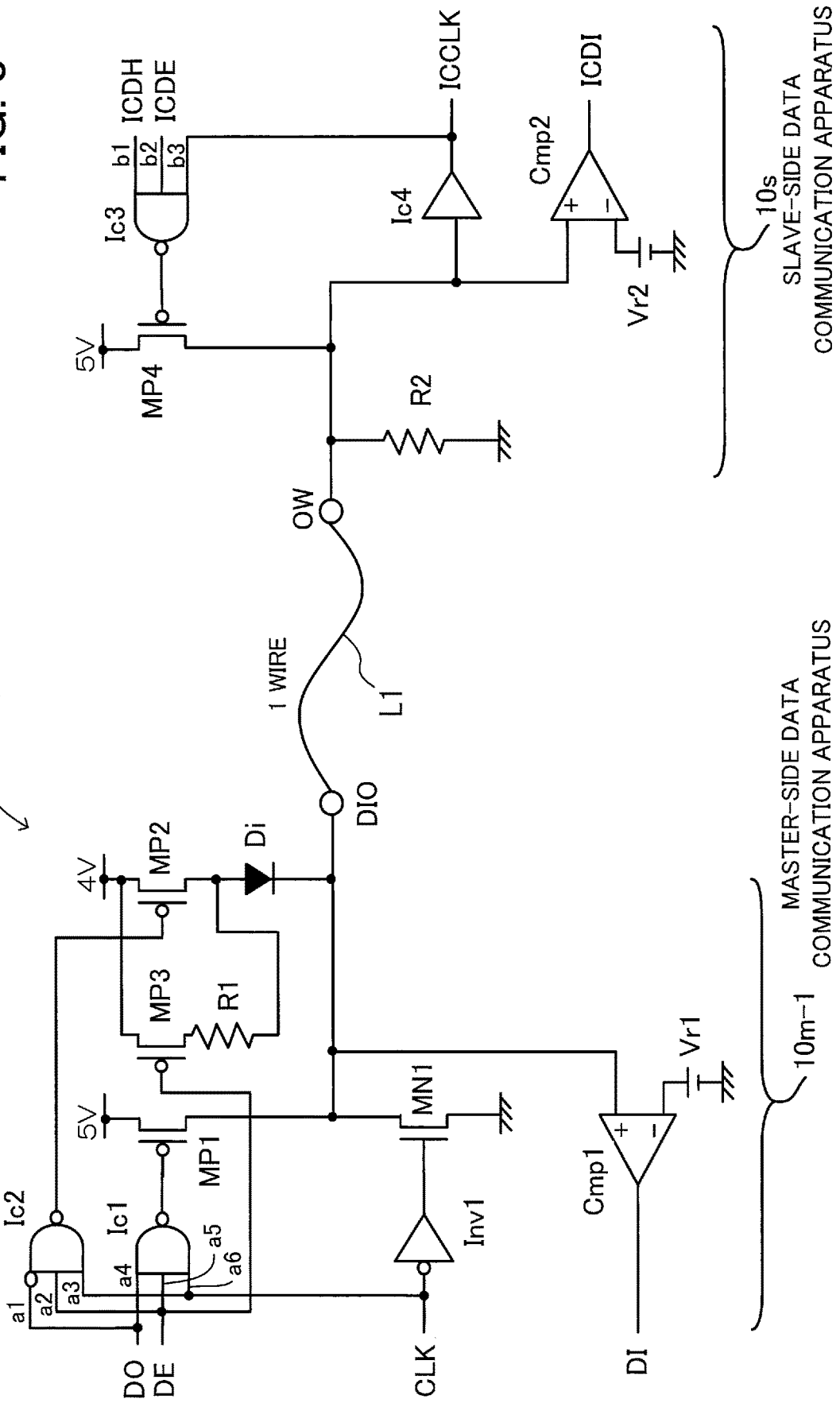
FIG. 8 illustrates a circuit configuration of a variation having a leak current suppression function.

FIG. 8 illustrates a circuit configuration of the variation having a leak current suppression function. A data communication system 1-2 includes a master-side data communication apparatus 10m-1 and the slave-side data communication apparatus 10s.

The master-side data communication apparatus 10m-1 is configured not to include the inverter Inv0 and the PMOS transistor MP0 illustrated in FIG. 2, but to instead include diode Di (forward direction voltage Vf being 0.7 V, for example) as the connection breaking circuit 1a-1.

The anode of diode Di is connected to the drain of the PMOS transistor MP2 and the other end of the resistor R1. The cathode of diode Di is connected to the drain of the PMOS transistor MP1, the drain of the NMOS transistor MN1, the positive input end of the comparator Cmp1, and the terminal DIO. In addition, the sources of the PMOS transistors MP2 and MP3 are connected to a 4-V power supply. The other components are the same as those of FIG. 2.

The aforementioned configuration causes the diode Di to be reverse-biased when the communication line L1 is at 5 V, thereby preventing leak current from flowing through the PMOS transistors MP2 and MP3.

Note that, when the PMOS transistors MP2 and MP3 are in on-states, the diode Di is forward-biased, thereby causing a voltage drop of the forward direction voltage Vf (0.7 V in the example). Accordingly, the PMOS transistors MP2 and MP3 are used with the source voltage thereof being set to 4.0 V, which is higher than 3.3 V by 0.7 V.

Next, a data communication system having an alarm function for notifying the master side of an abnormality at the slave side will be described.

Figure 9:
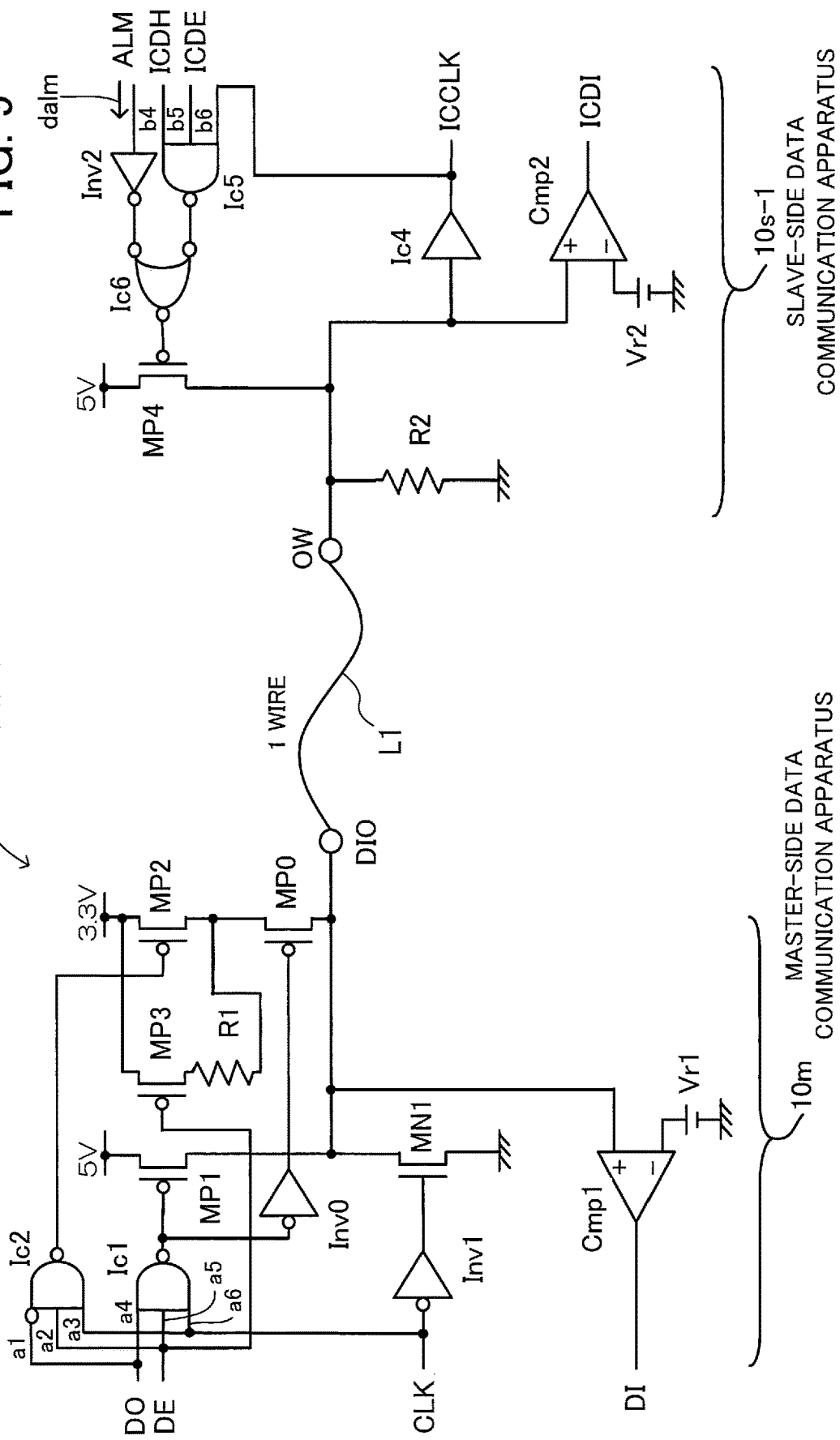
FIG. 9 illustrates an exemplary configuration of the data communication system.

FIG. 9 illustrates an exemplary configuration of the data communication system. A data communication system 1-3 includes the master-side data communication apparatus 10m and a slave-side data communication apparatus 10s-1.

The slave-side data communication apparatus 10s-1 includes, as a new terminal, a terminal ALM to which a signal for notifying about an abnormality of the slave (temperature abnormality, power supply voltage abnormality, or the like) is input.

In addition, the slave-side data communication apparatus 10s-1 is configured not to include the logical element Ic3 illustrated in FIG. 2 but to instead include logical elements Ic5 and Ic6, and an inverter Inv2.

The logical element Ic5 is a three-input/one-output logical operation circuit whose output turns to the L level when an input condition that three inputs to input ends b4 to b6 are at the H level is satisfied, or turns to the H level when an input condition other than the foregoing is satisfied.

The logical element Ic6 is a two-input/one-output logical operation circuit (equivalent to a two-input/one-output AND element) whose output turns to the L level when one of the two inputs is at the L level, or turns to the H level when both of the two inputs are at the H level.

Here, the terminal ALM is connected to the input end of the inverter Inv2. The terminal ICDH is connected to the input end b4 of the logical element Ic5, the terminal ICDE is connected to the input end b5 of the logical element Ic5, and the terminal ICCLK is connected to the input end b6 of the logical element Ic5 and the output end of the buffer Ic4.

The output end of the inverter Inv2 is connected to one of the input ends of the logical element Ic6, and the output end of the logical element Ic5 is connected to the other input end of the logical element Ic6. The output end of the logical element Ic6 is connected to the gate of the PMOS transistor MP4. The other components are the same as those of FIG. 2.

An alarm signal dalm transmitted from the control circuit of the slave-side data communication apparatus 10s-1 is input to the terminal ALM and, upon occurrence of an abnormality at the slave side, the alarm signal dalm turns to the H level.

Accordingly, the PMOS transistor MP4 turns on when the alarm signal turns to the H level regardless of the levels of the terminal ICDH and the terminal ICDE, thereby turning the communication line L1 to the 5-V state. Accordingly, the master-side data communication apparatus 10m may quickly recognize the abnormal condition at the slave side.

Figure 10:
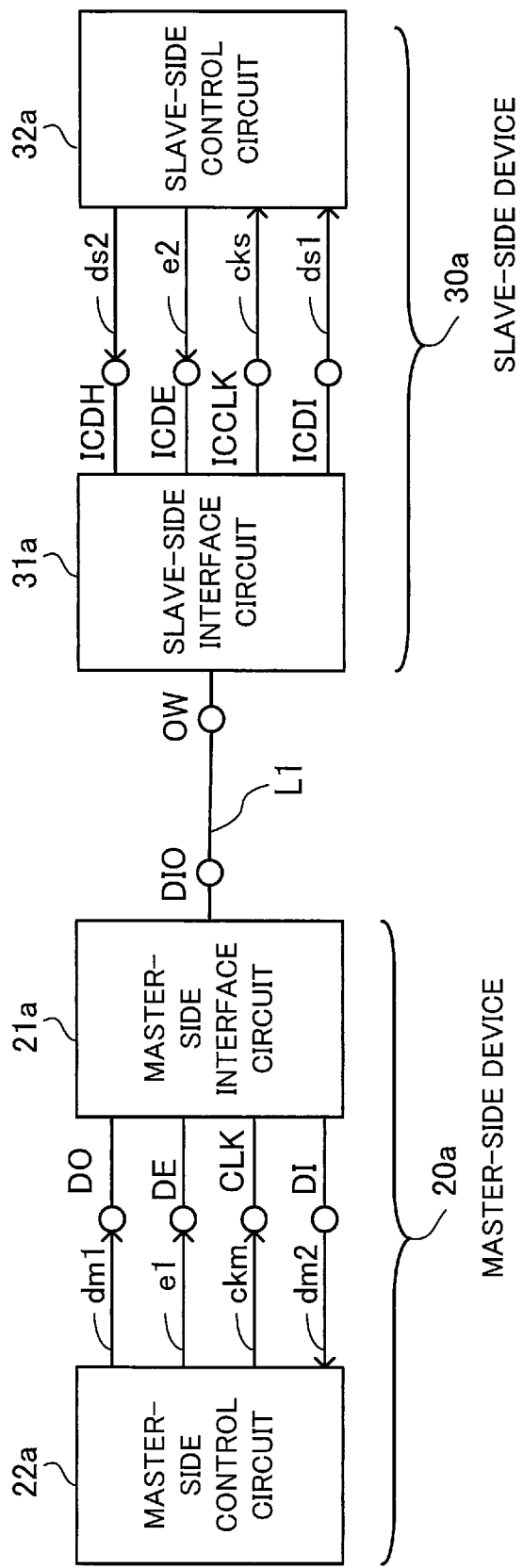
FIG. 10 illustrates an exemplary system configuration.

Next, an exemplary system configuration will be described, referring to FIGS. 10 to 13. FIG. 10 illustrates the exemplary system configuration. A data communication system 2-1 includes a master-side device 20a and a slave-side device 30a, the master-side device 20a and the slave-side device 30a being connected to each other via the communication line L1.

The master-side device 20a includes a master-side control circuit 22a and a master-side interface circuit 21a corresponding to the master-side data communication apparatus 10m. In addition, the master-side interface circuit 21a includes the terminals DO, DE, CLK and DI.

The master-side control circuit 22a transmits the data dm1 to the terminal DO, transmits the enable signal e1 to the terminal DE, and transmits the clock ckm to the terminal CLK. The master-side interface circuit 21a transmits the data dm2 from the terminal DI toward the master-side control circuit 22a.

The slave-side device 30a, on the other hand, includes a slave-side control circuit 32a and a slave-side interface circuit 31a corresponding to the slave-side data communication apparatus 10s. The slave-side interface circuit 31a includes the terminals ICDH, ICDE, ICCLK and ICDI.

The slave-side control circuit 32a transmits the data ds2 to the terminal ICDH, and transmits the enable signal e2 to the terminal ICDE. The slave-side interface circuit 31a transmits the clock cks from the terminal ICCLK and transmits the data ds1 from the terminal ICDI, toward the slave-side control circuit 32a.

Figure 11:
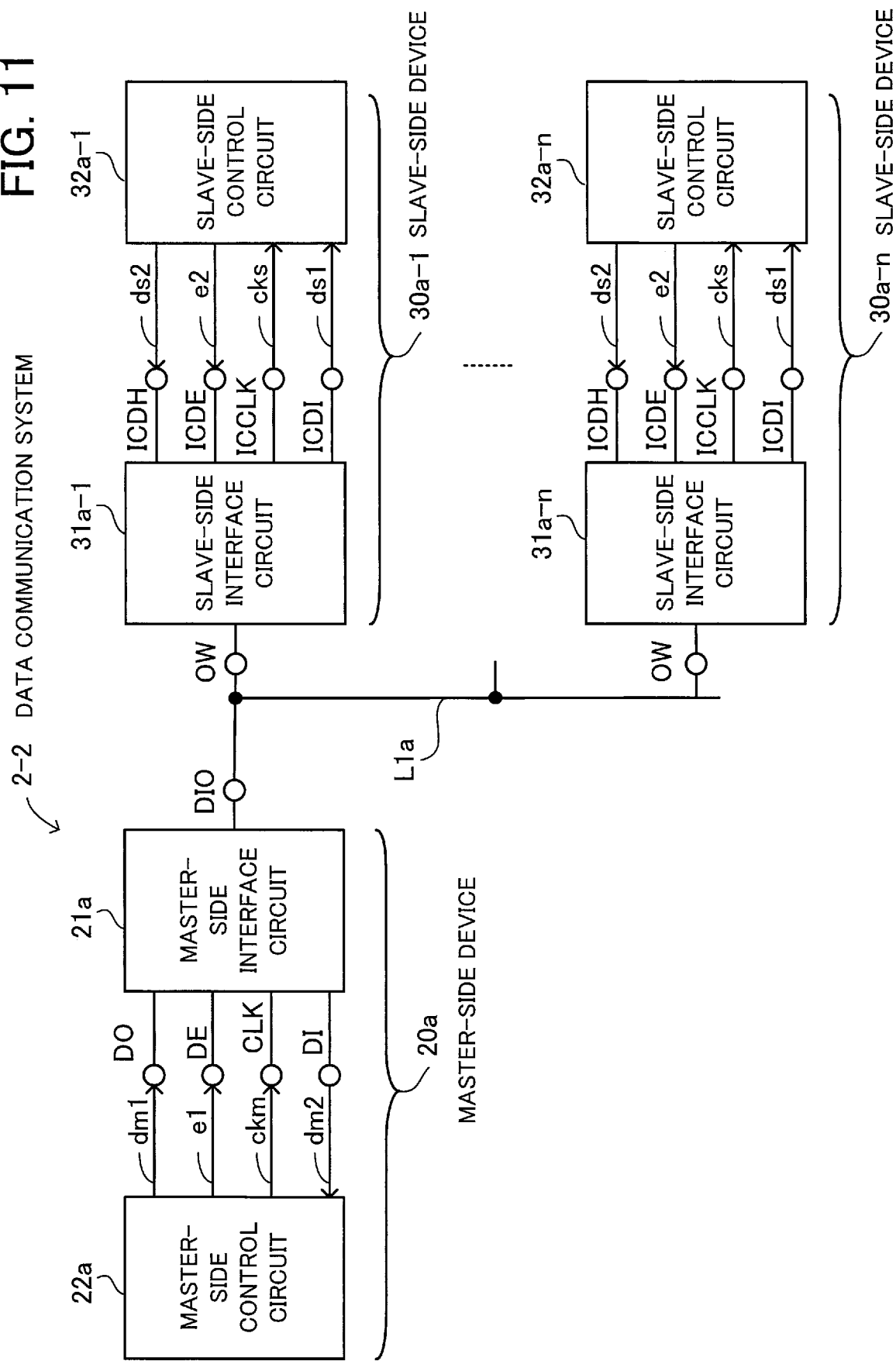
FIG. 11 illustrates another exemplary system configuration.

FIG. 11 illustrates another exemplary system configuration. There is illustrated an exemplary system configuration of a multi-wire type in which a plurality of slave-side devices is connected to a single-wire communication line. A data communication system 2-2 includes the master-side device 20a and slave-side devices 30a-1 to 30a-n, the master-side device 20a and the slave-side devices 30a-1 to 30a-n being connected to each other via a communication line L1a. The communication line L1a has a multi-wire configuration at the slave side.

The slave-side device 30a-1 includes a slave-side interface circuit 31a-1 and a slave-side control circuit 32a-1. Similarly, the slave-side device 30a-n includes a slave-side interface circuit 31a-n and a slave-side control circuit 32a-n. The connection relation between the control circuit side and the interface circuit side is the same as that of FIG. 10.

Figure 12:
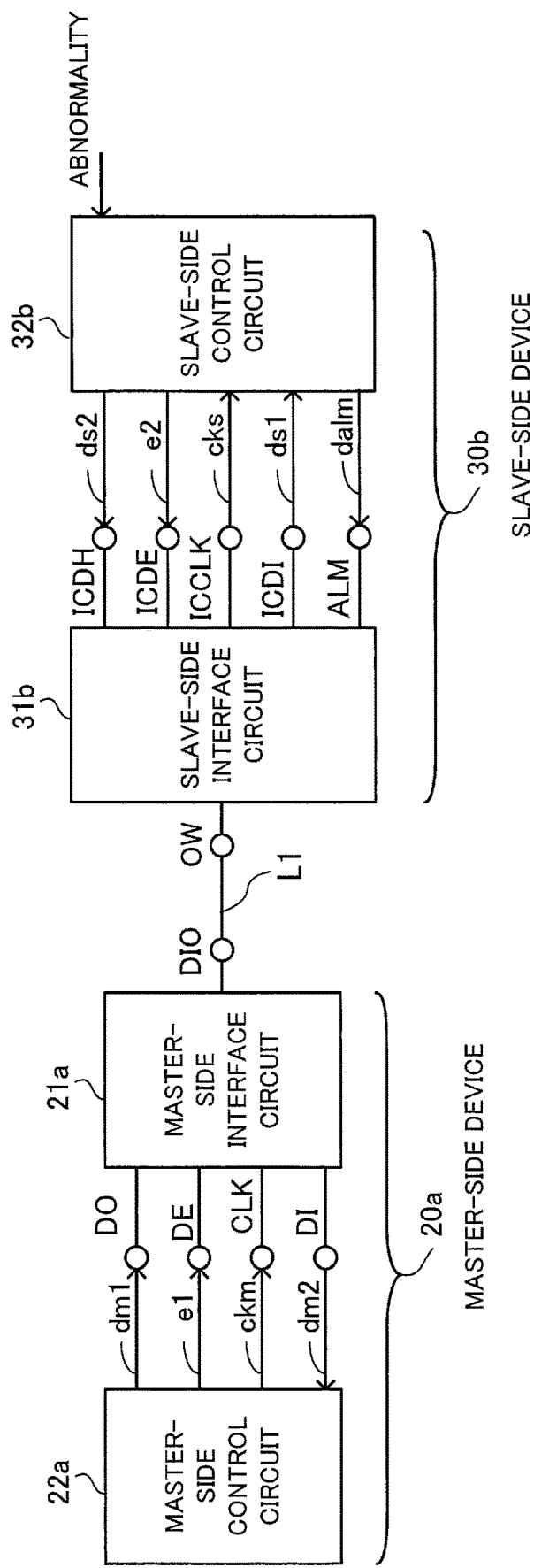
FIG. 12 illustrates another exemplary system configuration.

FIG. 12 illustrates a yet another exemplary system configuration. There is illustrated an exemplary system configuration in a case of having an alarm notification function. A data communication system 2-3 includes the master-side device 20a and a slave-side device 30b, the master-side device 20a and the slave-side device 30b being connected to each other via the communication line L1.

The slave-side device 30b includes a slave-side interface circuit 31b and a slave-side control circuit 32b. The slave-side interface circuit 31b further includes a terminal ALM besides the terminals ICDH, ICDE, ICCLK and ICDI.

Upon receiving an abnormality notification from a higher level, the slave-side control circuit 32b transmits the alarm signal dalm at the H level to the terminal ALM. The other components are the same as those of FIG. 10.

Figure 13:
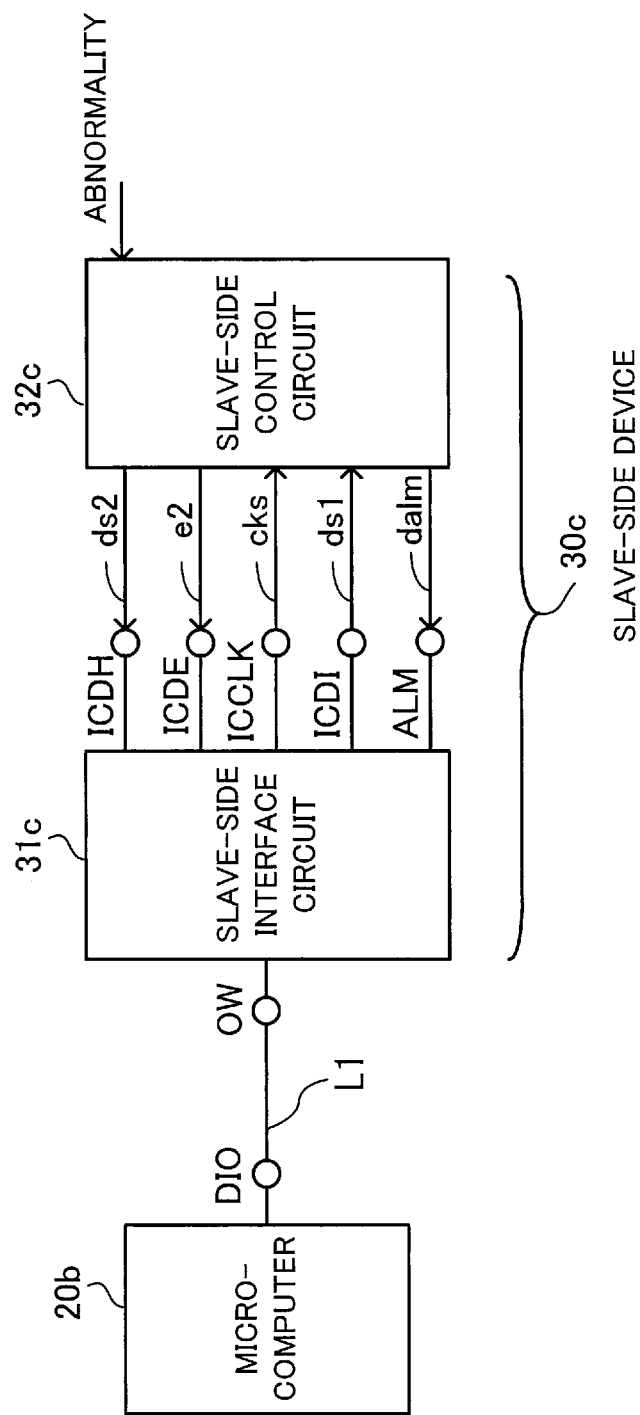
FIG. 13 illustrates another exemplary system configuration.

FIG. 13 illustrates a yet another exemplary system configuration. There is illustrated an exemplary system configuration in which the master side is replaced by a microcomputer. A data communication system 2-4 includes a microcomputer 20b and a slave-side device 30c, the microcomputer 20b and the slave-side device 30c being connected to each other via the communication line L1. The other components are the same as those of FIG. 12.

Here, using the present data communication system for IC mass production test and the like in a system configuration as described above makes it possible to efficiently perform the mass production test in a collective manner by providing, for example, a multi-wired connection illustrated in FIG. 11, with the master-side device being the tester and the slave-side device being the IC.

In addition, the communication function becomes unnecessary after completion of the mass production test, and it suffices to notify about only an abnormal output from the slave side to the master side. Therefore, it turns out that the communication line L1 in the configuration illustrated in FIGS. 12 and 13 is used as a line for notifying about abnormality detection.

Figure 14A:
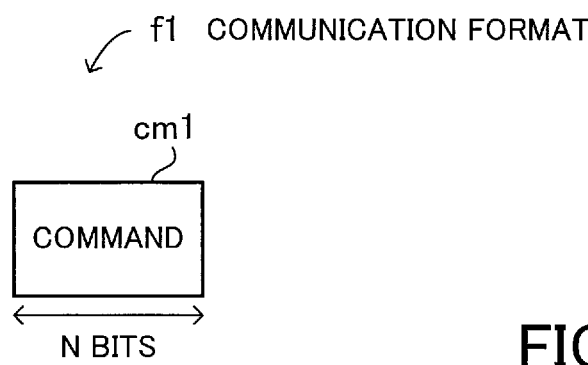
FIGS. 14A and 14B each illustrate a communication format.
Figure 14B:
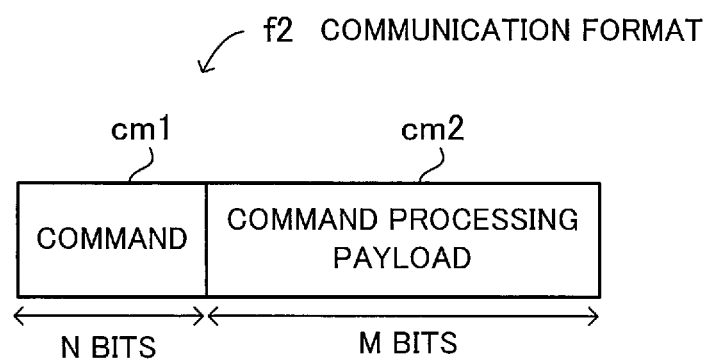

Next, communication formats will be described. FIGS. 14A and 14B each illustrate a communication format. FIG. 14A illustrate a communication format f1 specific to an N-bit command cm1.

The communication format f1 is used when the master-side data communication apparatus 10m performs only some setting for the slave-side data communication apparatus 10s, which does not need data exchange.

For example, when resetting (initializing) the slave side, the master-side data communication apparatus 10m transmits the command cm1 instructing to perform resetting to the slave side, and the slave-side data communication apparatus 10s, upon receiving the command cm1, performs resetting.

FIG. 14B illustrates a communication format f2 including the N-bit command cm1 and an M-bit command processing payload cm2.

The communication format f2 is used when the master-side data communication apparatus 10m performs data writing and reading to and from the slave-side data communication apparatus 10s which needs data exchange.

When writing data, the master-side data communication apparatus 10m transmits, to the slave-side data communication apparatus 10s, the command cm1 instructing data writing and a command processing payload cm2 to which the data to be written has been inserted.

In addition, when reading data, the master-side data communication apparatus 10m transmits the command cm1 instructing data reading to the slave side, and the slave-side data communication apparatus 10s, upon receiving the command cm1, inserts, in the command processing payload cm2, the data which has been read on the basis of the instruction of the command cm1, and sends it back.

Figure 15A:
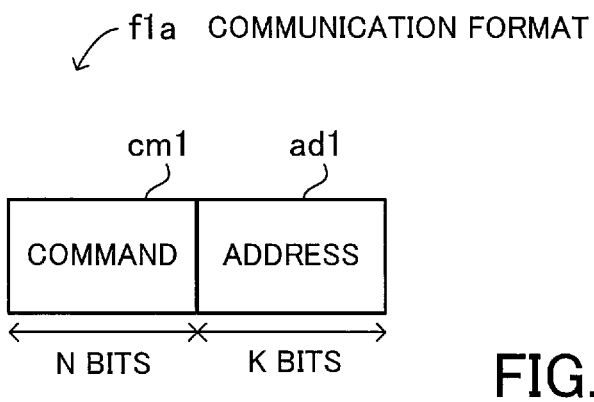
FIGS. 15A and 15B each illustrate another communication format.
Figure 15B:
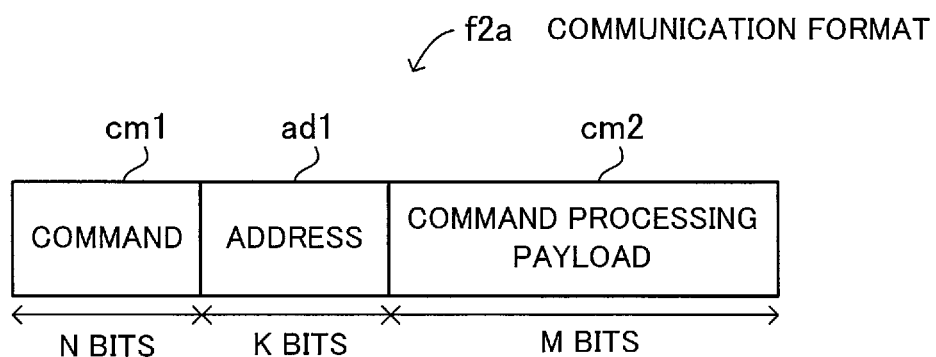

FIGS. 15A and 15B each illustrate another communication format. FIG. 15A illustrates a communication format f1a including the N-bit command cm1 and a K-bit address ad1. FIG. 15B illustrates a communication format f2a including the N-bit command cm1, the M-bit command processing payload cm2, and the K-bit address ad1.

The aforementioned communication formats f1a and f2a are applied to the data communication system 2-2 illustrated in FIG. 11, the address ad1 having set therein address values of slave-side devices 30a-1 to 30a-n (or address values of slave-side interface circuits 31a-1 to 31a-n).

Figure 16:
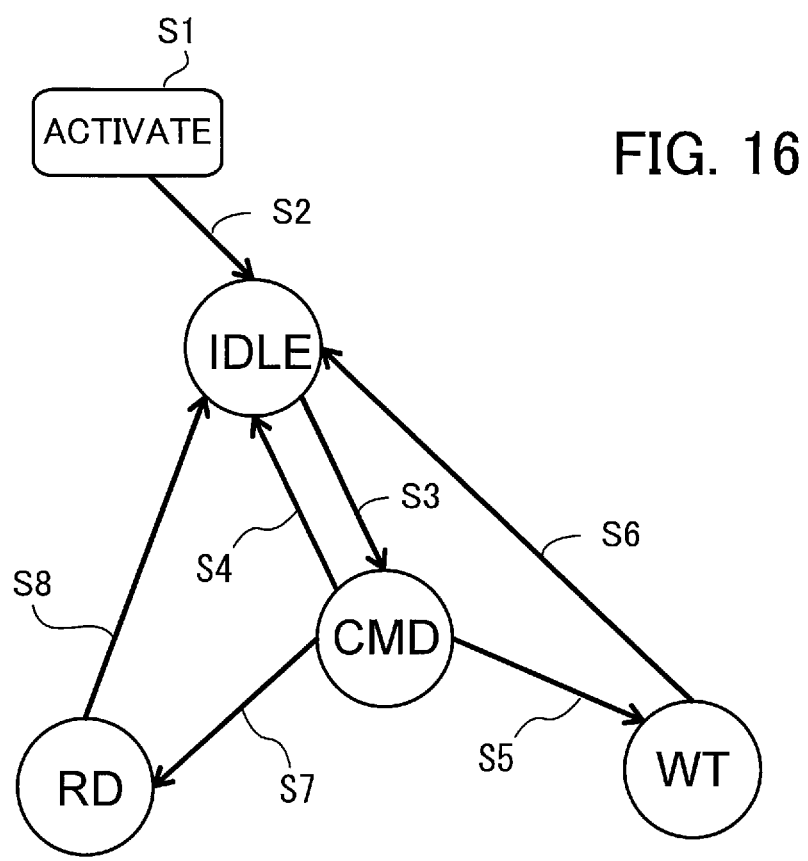
FIG. 16 illustrates a state transition.

Next, a state transition will be described. FIG. 16 illustrates a state transition. There is illustrated a state transition when performing communication between the master and the slave using the communication format which does not have a field of the address ad1.

(S1) The master-side device and the slave-side device are activated.

(S2) The master-side device and the slave-side device transition to an operation-wait (IDLE) state.

(S3) The master-side device and the slave-side device transition to a command-set state (CMD). In the command-set state (CMD), setting, receiving, decoding, or the like, of a command are performed.

(S4) When the command is software-reset, for example, the command-set state (CMD) transitions to the operation-wait state (IDLE).

(S5) When the command is data writing, the command-set state (CMD) transitions to the data writing state (WT). In the data writing state (WT), the data to be written is transmitted from the master-side data communication apparatus 10m to the slave-side data communication apparatus 10s.

(S6) Upon completion of the data writing, the data writing state (WT) transitions to the operation-wait state (IDLE).

(S7) When the command is data reading, the command-set state (CMD) transitions to the data reading state (RD). In the data reading state (RD), the data to be read is transmitted from the slave-side data communication apparatus 10s to the master-side data communication apparatus 10m.

(S8) Upon completion of the data reading, the data reading state (RD) transitions to the operation-wait state (IDLE).

Note that, in the foregoing description, respective processing times of the command-set state (CMD), the data writing state (WT), and the data reading state (RD) have been preliminarily determined according to the number of clocks. Therefore, a clock counting process is performed by the master-side and the slave-side control circuits to detect a timing of state transition.

Figure 17:
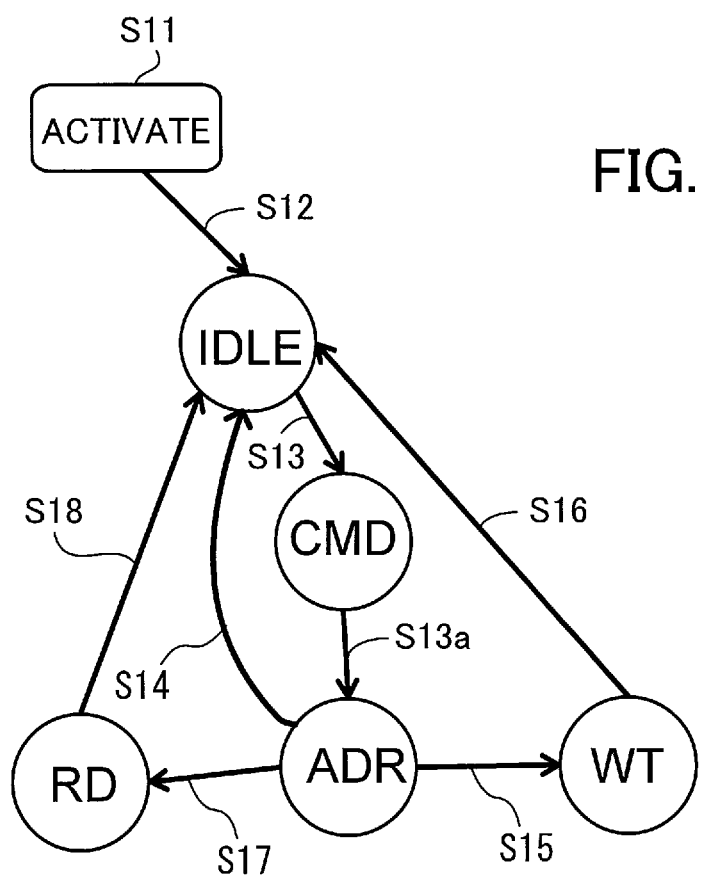
FIG. 17 illustrates another state transition.

FIG. 17 illustrates another state transition. There is illustrated a state transition when performing communication between the master and the slave using a communication format having a field of the address ad1.

(S11) The master-side device and the slave-side device are activated.

(S12) The master-side device and the slave-side device transition to the operation-wait state (IDLE).

(S13) The master-side device and the slave-side device transition to the command-set state (CMD).

(S13a) The master-side device and the slave-side device transition to an address communication state (ADR). In the address communication state (ADR), a predetermined address is transmitted from the master-side device to the slave-side device.

(S14) The slave-side device to which the address does not belong transitions to the operation-wait state (IDLE). In addition, when the command is software-reset, for example, the slave-side device having the relevant address performs resetting and transitions to the operation-wait state (IDLE).

(S15) When the command is data writing, the slave-side device having the relevant address transitions to the data writing state (WT).

(S16) Upon completion of the data writing, the data writing state (WT) transitions to the operation-wait state (IDLE).

(S17) When the command is data reading, the slave-side device having the relevant address transitions to the data reading state (RD).

(S18) Upon completion of the data reading, the data reading state (RD) transitions to the operation-wait state (IDLE).

Note that, in the foregoing, the processing time of the address communication state (ADR) has also been preliminarily determined on the basis of the number of clocks, and the master-side and the slave-side control circuits perform a clock count process to detect the timing of transition from the processing performed in the address communication state (ADR) to another state.

As has been described above, the configuration of the data communication system of the present disclosure makes it possible to efficiently perform single-wire bidirectional data communication with a small circuit scale.

Note that the configuration of FIG. 2 described in Japanese Laid-open Patent Publication No. 2012-169746 is not able to perform H-level transmission from the slave to the master and therefore is not able to recognize the power supply state at the slave side.

In contrast, with the data communication system of the present disclosure, the slave-side data communication apparatus 10s is able to transmit the H-level to the master-side data communication apparatus 10m when the slave-side data communication apparatus 10s is normally operating. On the contrary, the H-level is not transmitted in a case where the power supply of the slave-side data communication apparatus 10s has been shut down, or the operation voltage has dropped (only the GND level is output).

As thus described, it becomes possible to recognize the power supply state of the slave-side data communication apparatus 10s (or the slave-side device) by determining, at the master side, whether or not the slave-side data communication apparatus 10s is able to transmit the H-level, or checking the voltage value of the H-level which has been transmitted.

Next, the slave-side device will be described in detail. In the following description, the slave-side device will be referred to as a sensor apparatus which is assumed to be, for example, a sensor for detecting a physical quantity such as temperature or pressure.

Figure 18:
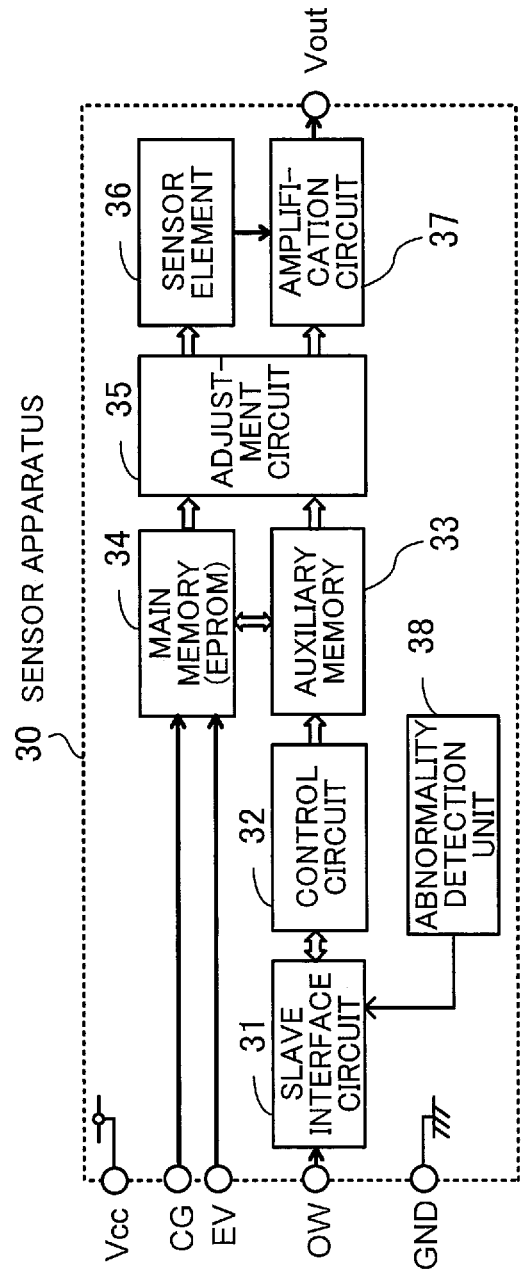
FIG. 18 illustrates an exemplary configuration of a sensor apparatus.

FIG. 18 illustrates an exemplary configuration of a sensor apparatus. A sensor apparatus 30 includes a slave-side interface circuit 31, a control circuit 32, an auxiliary memory 33, a main memory 34, an adjustment circuit 35, a sensor element 36, an amplification circuit 37, and an abnormality detection unit 38. In addition, there are provided the terminal OW, a terminal Vout, a terminal EV, and a terminal CG as terminals, besides the Vcc and the GND terminals of the device power supply.

Note that the sensor apparatus 30 is configured with only active elements and passive elements formed on the same semiconductor chip and manufactured in the CMOS process.

The terminal OW is an input/output interface terminal connected to the communication line L1 to communicate with the master-side data communication apparatus 10m, as described above. A synthesized signal of data and a clock is input to or output from the terminal OW. The terminal Vout is a terminal from which a result detected by the sensor element 36 is output.

The terminal EV and the terminal CG are voltage application terminals used when writing data to the main memory 34. The main memory 34 is specifically an EPROM (Erasable Programmable Read Only Memory) configured with a floating MOS array.

Accordingly, when writing data to the EPROM, a voltage which is higher than the operating power supply Vcc of the sensor apparatus 30 is applied to the terminal EV, and further a voltage for driving the floating gate is applied to the terminal CG.

The slave-side interface circuit 31 corresponds to the slave-side data communication apparatus 10s described above, and communicates with the master-side device via the communication line L1 connected to the terminal OW. The control circuit 32 corresponds to the slave-side control circuit described above, referring to FIGS. 10 to 13.

The auxiliary memory 33 temporarily stores data (trimming data) input from the terminal OW. The auxiliary memory 33 is configured with a shift register, which is, for example, a 48-bit shift register.

The main memory 34, which is an EPROM, stores the trimming data stored in the auxiliary memory 33 by an electric re-write operation (the main memory 34 will be referred to as an EPROM 34, in the following).

The adjustment circuit 35 adjusts output characteristics (sensitivity) of the sensor element 36 on the basis of the trimming data stored in the auxiliary memory 33 or the trimming data stored in the EPROM 34. Alternatively, the adjustment circuit 35 adjusts an offset, gain and the like of the amplification circuit 37.

The sensor element 36 generates an electrical signal according to the detected physical quantity. The amplification circuit 37 amplifies, and outputs to the outside via the terminal Vout, the electrical signal output from the sensor element 36. The abnormality detection unit 38 detects an abnormality which has occurred in the sensor apparatus 30, and transmits an alarm signal to the slave-side interface circuit 31.

Here, the auxiliary memory 33 receives, via the slave-side interface circuit 31 and the control circuit 32, and stores the temporary trimming data transmitted from the terminal OW. The adjustment circuit 35 adjusts output characteristics of the sensor element 36, or the offset, gain and the like, of the amplification circuit 37, using the temporary trimming data stored in the auxiliary memory 33.

In the aforementioned case, the control circuit 32 causes the adjustment circuit 35 to measure the output of the sensor element 36 or the output of the amplification circuit while changing the trimming value using a plurality of temporary trimming data, and fix the trimming data that provides a desired output value.

Upon fixing the trimming data, the control circuit 32 stores the trimming data in the EPROM 34. Subsequently, in a normal use state, the adjustment circuit 35 adjusts the outputs of the sensor element 36 and the amplification circuit 37 using the trimming data stored in the EPROM 34.

Next, a command analysis performed by the control circuit 32 will be described. The control circuit 32 includes a 3-bit command register (mode setting register), and the 3-bit command register analyzes a 3-bit command transmitted from the master side using a predetermined number of clocks.

FIG. 19 illustrates exemplary functions of the 3-bit command register. A table T1 lists functions of 3-bit command register values. Note that fields of Nos. 2, 6 and 7 are blank.

In the case of No. 1, the name is "output" and the control circuit 32 outputs serial data when a command of "000" is transmitted from the master side.

In the case of No. 3, the name is "reference" and the control circuit 32 sets the content of the EPROM 34 to a shift register (S.R.) which is the auxiliary memory 33 when a command of "010" is transmitted from the master side.

In the case of No. 4, the name is "adjustment" and the control circuit 32 outputs the logical sum (OR) of the contents of the shift register (S.R.) and the EPROM 34 to a D/A converter in the sensor apparatus 30 when a command of "011" is transmitted from the master side.

In the case of No. 5, the name is "writing" and the control circuit 32 writes the content of the shift register (S.R.) to the EPROM 34 when command of "100" is transmitted from the master side.

In the case of No. 8, the name is "reset" and the control circuit 32 resets the shift register (S.R.) and the mode setting when a command of "111" is transmitted from the master side.

Figure 20:
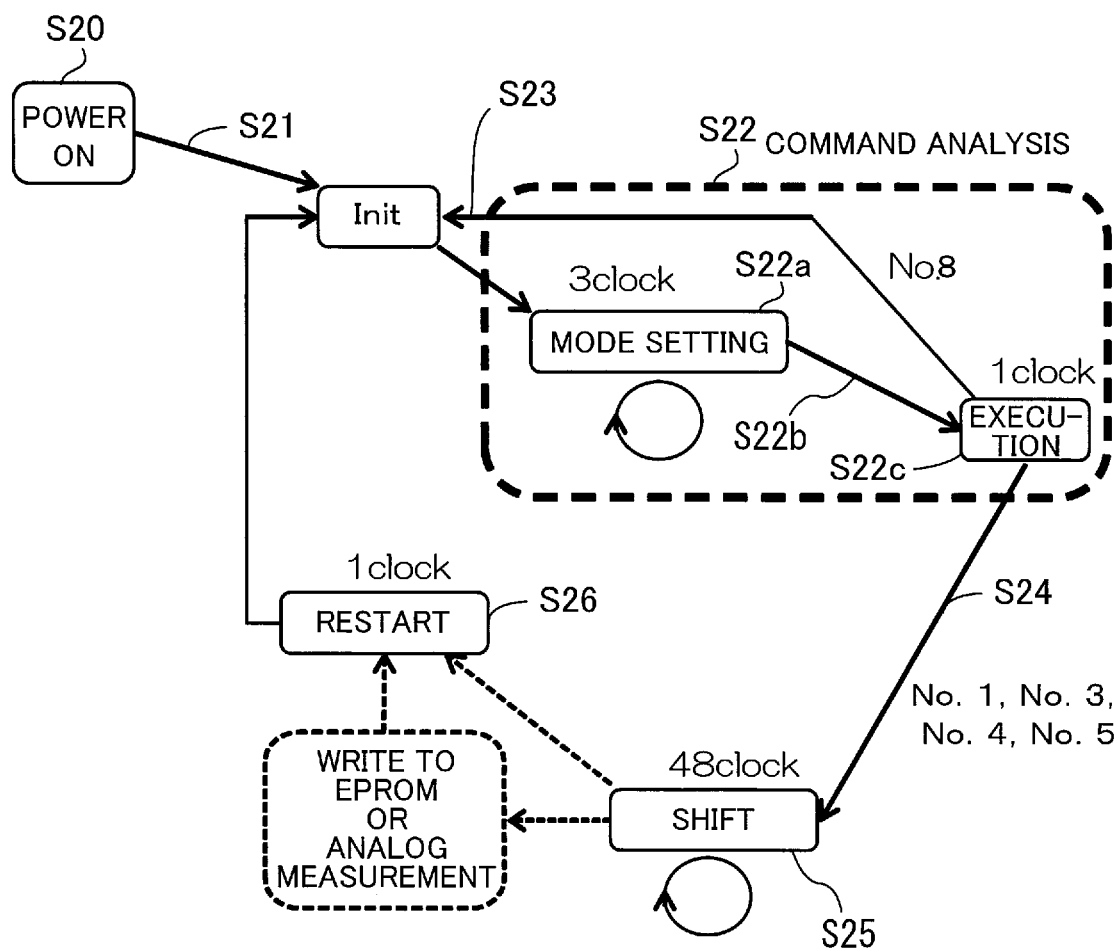
FIG. 20 illustrates a state transition.

Next, a state transition when performing trimming control on the EPROM 34 will be described. FIG. 20 illustrates a state transition, and FIG. 21 is an explanatory diagram illustrating respective states. A table T2 of FIG. 21 lists respective states in the state transition diagram of FIG. 20. Here, "No." in the state transition diagram illustrated in FIG. 20 corresponds to "No." in the table T1 of FIG. 19.

(S20) The sensor apparatus 30 is powered on.

(S21) After power-on, the sensor apparatus 30 transitions to an initialization state (Init) according to a reset operation performed by the control circuit 32. The initialization state (Init) is a data input wait state via the slave-side interface circuit 31.

(S22) The control circuit 32 transitions to a command analysis state. The command analysis state is a state for analyzing a command transmitted from the master side. Command analysis is performed using four clocks, on the basis of the value set to the 3-bit command register in the control circuit 32.

(S22a) when performing a command analysis using four clocks, the control circuit 32 uses three clocks out of the four clocks for mode setting.

(S22b) Upon setting the mode, the control circuit 32 transitions to an execution state.

(S22c) The execution state is a state for determining, for the set mode, which state to transition to next. Here, the control circuit 32 determines the state to transition to next, using one clock out of the four clocks.

(S23) When the mode setting is "reset" (the case of No. 8 of table T1), the control circuit 32 transitions to the initialization state (Init) after having performed software-reset.

(S24) When the mode setting is any of Nos. 1, 3, 4 and 5 of the table T1, the control circuit 32 transitions to a shift state.

(S25) The shift state is a state for performing the operations of the register values Nos. 1, 3, 4 and 5 of the 3-bit command register, and the 48-bit shift register, which is the auxiliary memory 33, performs a shift operation using 48 input clocks.

In the case of No. 1 (output), serial data is output after the 48-bit shift has been performed. In the case of No. (reference), the 48-bit shift operation is performed after the value of the EPROM 34 has been written to the 48-bit shift register.

Additionally, in the case of No. 4 (adjustment), the logical sum output of the value of the EPROM 34 and the data after the 48-bit shift is output to the D/A converter.

Furthermore, in the case of No. 5 (writing), the value of the 48-bit shift register is written to the EPROM 34.

(S26) Upon execution of the 48-bit shift operation and completion of operations in respective modes, the control circuit 32 initializes the mode setting in the next one clock and transitions to a restart state for transition to the initialization state (Init).

Note that the control circuit 32 also transitions to the restart state when the master-side device has written data to the EPROM 34 or performed an analog measurement, on the basis of voltage application to the terminals EV and CG.

Figure 22:
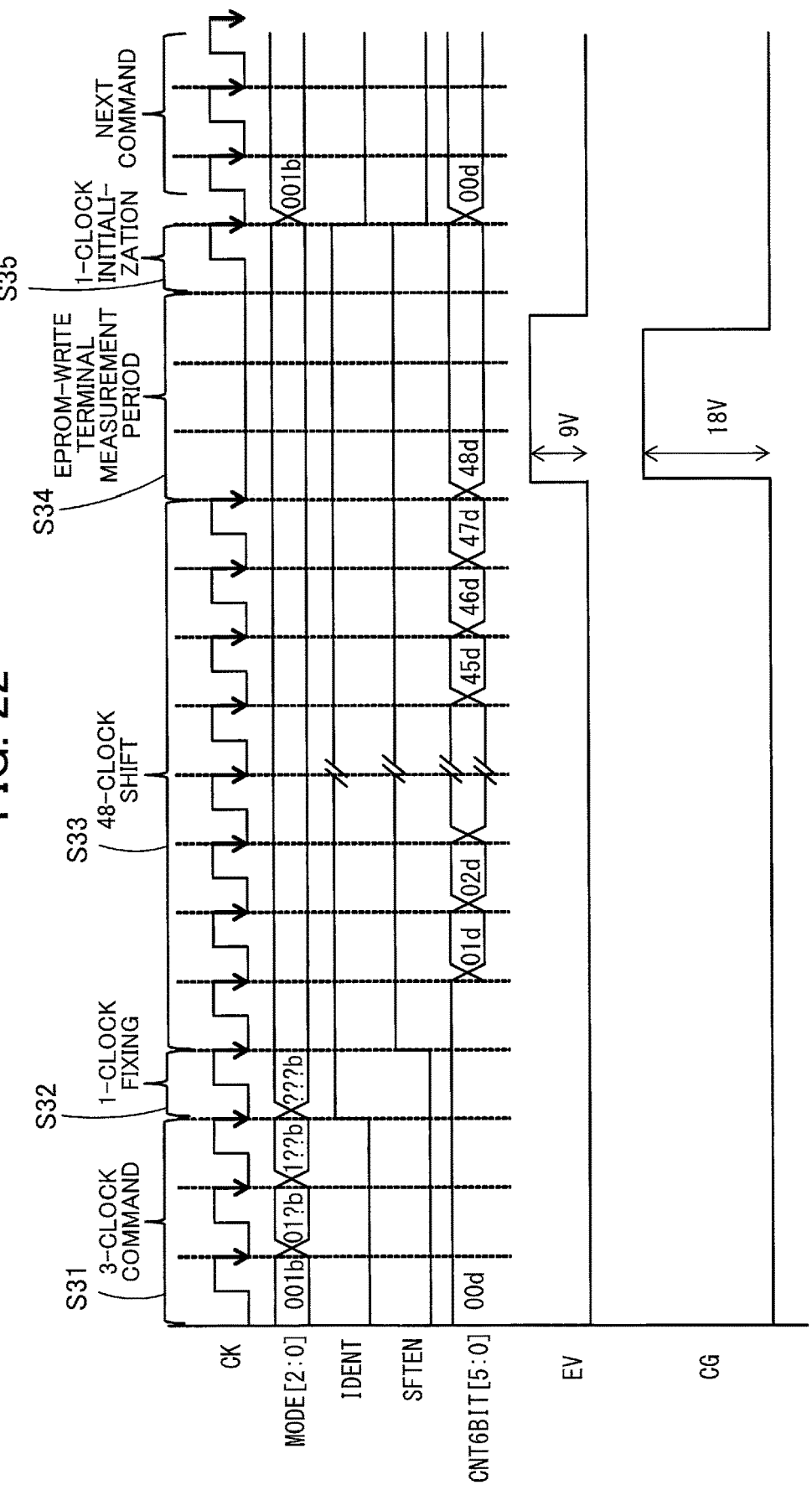
FIG. 22 is a time chart illustrating an operation in a write mode to an EPROM.

Next, an operation in the write mode to the EPROM 34 will be described. FIG. 22 is a time chart illustrating an operation in the write mode to the EPROM. Each of the signals CK, MODE (2:0), IDENT, SFTEN, and CNT6BIT (5:0) in FIG. 22 represents an internal signal in the control circuit 32. In addition, the symbol "?" in FIG. 22 indicates a data bit of 0 or 1 which has been input from the terminal OW, and the symbol "b" indicates that the number is binary (the same applies hereinafter).

The clock signal CK is a clock output from the aforementioned terminal ICCLK of the slave-side interface circuit 31. The mode setting signal MODE (2:0) is a value of the 3-bit command register. The first data (data illustrated at the left end in FIG. 23) 001b of the mode setting signal MODE (2:0) is the initial value of the mode setting signal MODE (2:0), which is shifted to the left each time an input clock signal CK is input, and the data which has been input from the terminal OW (the data bit 0 or 1 indicated by "?") is shifted into the least significant bit.

The signal IDENT is a signal which turns to the H level upon completion of an operation of writing 3 bits to the 3-bit command register, or turns to the L level when the 3-bit write operation has not been completed.

The shift-enable signal SFTEN is a signal which turns to the H level when being in a 48-clock shift state with regard to the 48-bit shift register, or turns to the L level in a state other than the foregoing.

The count-control signal CNT6BIT (5:0) is a value of a 6-bit counter for performing a 48-bit count.

Note that the voltages EV and CG indicate the voltages respectively applied to the terminal EV and the terminal CG, and the voltage EV is 9 V and the voltage CG is 18 V, for example, at the time of data writing to the EPROM 34.

(S31) During a 3-clock command period, a 3-bit command is written to the 3-bit command register according to the data which has been input from the terminal OW.

The 3-bit write operation is uncompleted during the aforementioned period and therefore the signal IDENT is at the L level. In addition, with the 48-bit shift register not being in the shift operation, the shift-enable signal SFTEN is at the L level and, since the 6-bit counter has not yet started counting, the output value thereof is 00d (d is a symbol indicating that 00 is a decimal number. The same applies hereinafter.)

(S32) Upon entering a 1-clock fixing period, the write operation to the 3-bit command register is completed, and therefore the signal IDENT turns to the H level.

(S33) During the 48-clock shift period, the 48-bit shift register is in the 48-clock shift state. The shift-enable signal SFTEN has turned to the H level after confirmation of the shift operation with a 1-clock delay after the rise of the signal IDENT. In addition, the count-control signal CNT6BIT (5:0) has started the count operation with a 1-clock delay after the rise of the shift-enable signal SFTEN.

(S34) The count value has reached 48 in an EPROM-write terminal measurement period, and therefore the voltages EV and CG are applied, so that the data corresponding to the mode setting signal MODE (2:0) is written to the EPROM 34.

(S35) During a 1-clock initialization period, initialization is performed for the next command input. In other words, a new command setting is performed, and therefore the 3-bit command register is reset and the mode setting signal MODE (2:0) takes the initial value 001b of the next cycle.

In addition, the signal IDENT and the shift-enable signal SFTEN turn to the L level from the next cycle, the 6-bit counter is also reset, and the count value is set to 00d from the next cycle.

In the aforementioned timing chart, returning to the Init state again from the Init state turns out to be a 53-clock operation in the write mode to the EPROM 34.

Figure 23:
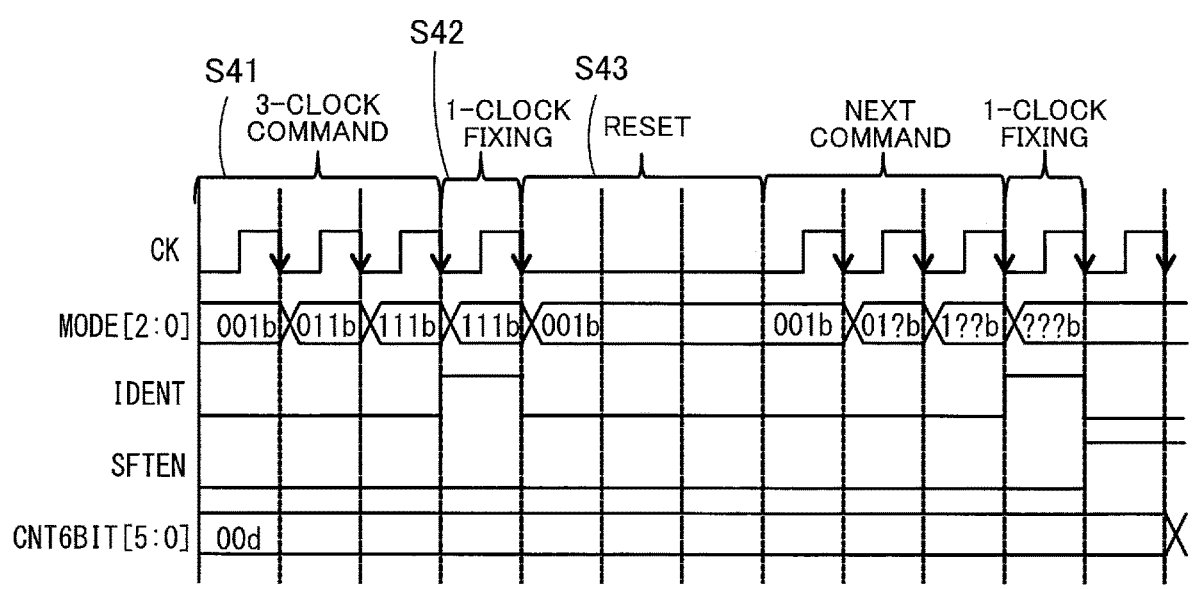
FIG. 23 is a time chart illustrating an operation in a reset mode.

FIG. 23 is a time chart illustrating an operation in the reset mode.

(S41) The initial value of the mode setting signal MODE (2:0) is 001b. During the 3-clock command period, a 3-bit command 111b is sequentially written to the 3-bit command register according to the data which has been input from the terminal OW.

The 3-bit write operation is uncompleted and therefore the signal IDENT is at the L level. In addition, with the 48-bit shift register not being in the shift operation, the shift-enable signal SFTEN is at the L level and, since the 6-bit counter has not yet started counting, the output value thereof is 00d.

(S42) Upon entering the 1-clock fixing period, the write operation to the 3-bit command register is completed, and therefore the signal IDENT turns to the H level. The reset command is recognized during this period.

(S43) It is the reset period. The 3-bit command register is reset, and the mode setting signal MODE (2:0) takes a value 001b, which is the initial value. In addition, with the signal IDENT having turned to the L level and the 48-bit shift register not having been activated, the shift-enable signal SFTEN is still at the L level, and with the 6-bit counter not having been activated, the count value remains 00d.

In the aforementioned timing chart, returning to the Init state again from the Init state turns out to be a 4-clock operation in the reset mode.

Figure 24:
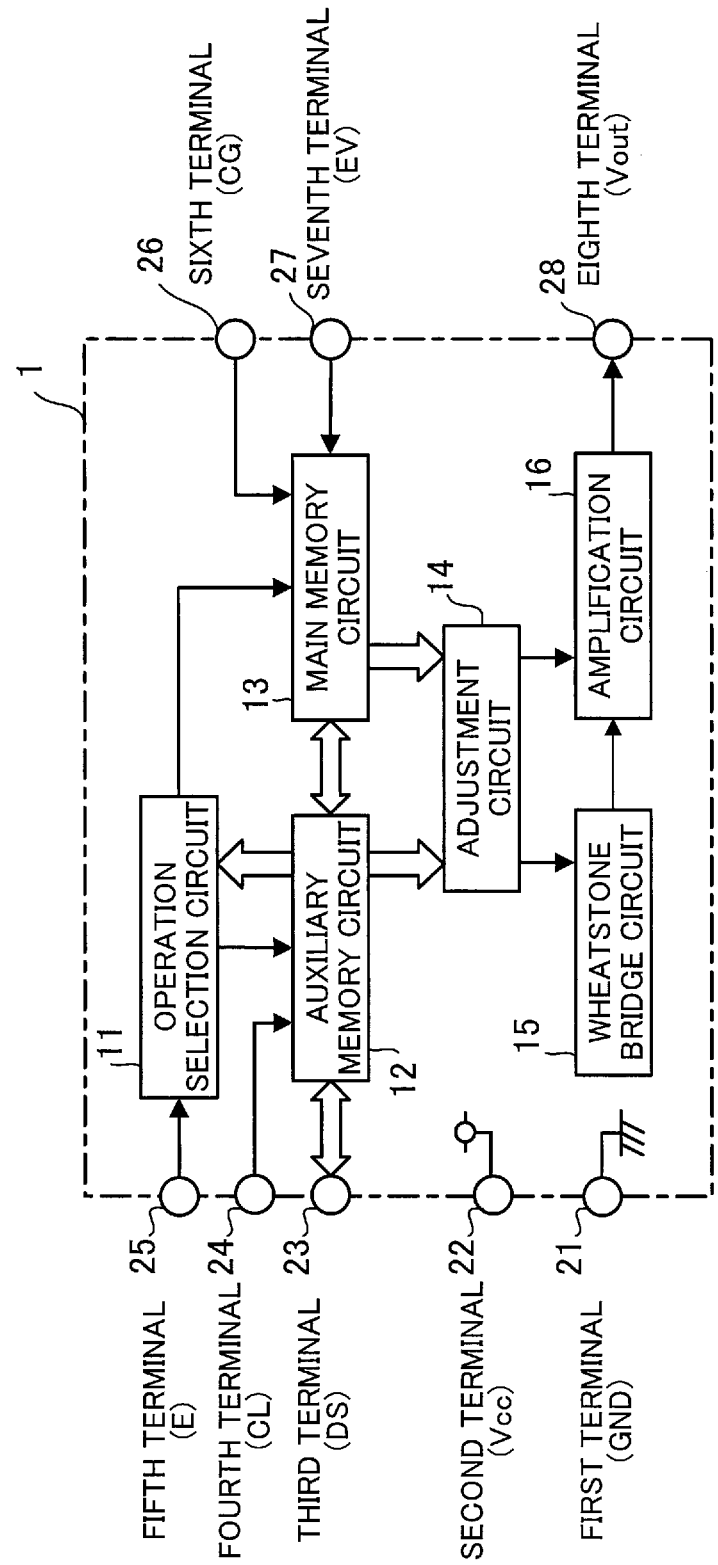
FIG. 24 illustrates a configuration of a semiconductor physical quantity sensor apparatus.

Next, a difference in terms of configuration between the sensor apparatus 30 and the aforementioned Japanese Laid-open Patent Publication No. 2002-310735 will be described. FIG. 24 illustrates a configuration of a semiconductor physical quantity sensor apparatus. There is illustrated the semiconductor physical quantity sensor apparatus illustrated in FIG. 1 of Japanese Laid-open Patent Publication No. 2002-310735.

The semiconductor physical quantity sensor apparatus of Japanese Laid-open Patent Publication No. 2002-310735 has eight terminals, namely, the first to the eighth terminals provided therein. When used as an automobile pressure sensor, for example, such a semiconductor physical quantity sensor apparatus is installed in a limited space near the site to be detected in terms of reducing pressure loss or minimizing piping.

Accordingly, a smaller sensor apparatus is desirable and, since the number of terminals of a package to be molded is determined by the number of terminals on a semiconductor chip, it is desired to further reduce the number of terminals for downsizing.

To meet such a desire, the sensor apparatus 30 of the present disclosure attempts to reduce the number of terminals by providing, on an interface part, the slave-side interface circuit 31 having the function of the slave-side data communication apparatus 10s, and the control circuit 32.

In other words, there are a total of six terminals including the terminals OW, Vout, EV and CG, besides the Vcc and the GND of the power supply terminal, as illustrated in FIG. 18, whereby the number of terminals has been reduced from eight to six.

Here, the slave-side interface circuit 31 and the control circuit 32 of the sensor apparatus 30 correspond to the operation selection circuit in the semiconductor physical quantity sensor apparatus illustrated in FIG. 24.

Combining the data and clocks from the terminals DS and CLK of the semiconductor physical quantity sensor apparatus illustrated in FIG. 24 makes the sensor apparatus 30 controllable by a single terminal OW. In addition, the enable signal of the terminal E of the semiconductor physical quantity sensor apparatus illustrated in FIG. 24 is generated in the control circuit 32.

As thus described, the sensor apparatus 30 is configured to determine whether the logic level is H or L by three voltage levels (5 V, 3.3 V, GND) resulted from superimposing clocks and data, and additionally include a 3-bit command register for holding a mode that determines how the EPROM 34 is to be controlled.

Accordingly, it becomes possible to eliminate the terminals DS, CLK and E of the semiconductor physical quantity sensor apparatus illustrated in FIG. 24, perform communication with the master side using the terminal OW, and reduce the number of terminals for downsizing. As thus described, the sensor apparatus 30 may be provided as a compact device with a reduced number of terminals for performing sensitivity adjustment, temperature characteristic adjustment, and offset adjustment by electric trimming using the EPROM 34.

According to an aspect of the present disclosure, reduction of circuit scale becomes possible.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A data communication system, comprising:
    a master-side data communication apparatus configured to perform bidirectional communication with a slave side via a single-wire communication line; and
    a slave-side data communication apparatus configured to perform bidirectional communication with the master-side data communication apparatus via the single-wire communication line,
    wherein the master-side data communication apparatus includes:
        a first transistor which is connected to the single-wire communication line and is configured to perform switching according to an input clock;
        a second transistor which is connected to the single-wire communication line and is configured to perform switching according to write data;
        a master-side data reproduction circuit configured to reproduce read data transmitted from the slave-side data communication apparatus via the single-wire communication line, and
    wherein the slave-side data communication apparatus includes:
        a clock reproduction circuit configured to reproduce the input clock transmitted from the master-side data communication apparatus via the single-wire communication line;
        a slave-side data reproduction circuit configured to reproduce the write data transmitted from the master-side data communication apparatus via the single-wire communication line; and
        a third transistor which is connected to the single-wire communication line and is configured to perform switching both according to the input clock reproduced by the clock reproduction circuit and according to the read data.

2. The data communication system according to claim 1, wherein
    in a write operation, the first transistor switches according to the input clock and the second transistor switches according to the write data so as to superimpose the write data on the input clock to produce superimposed write data to be transmitted via the single-wire communication line, and
    in the write operation, the clock reproduction circuit reproduces the input clock using the superimposed write data and the slave-side data reproduction circuit reproduces the write data using the superimposed write data.

3. The data communication system according to claim 2, wherein
    the master-side data communication apparatus further includes a fourth transistor which is connected to the single-wire communication line and switches according to the input clock and the write data,
    the second transistor switches according to the input clock, and
    the superimposed write data has a first level according to the first transistor switching, a second level according to the fourth transistor switching, and a third level according to the second transistor switching, the second level being higher than the first level, the third level being higher than the second level.

4. The data communication system according to claim 2, wherein
    the superimposed write data has a first level according to the input clock, a second level according to the write data, and a third level according to the write data, the second level being higher than the first level, the third level being higher than the second level,
    the slave-side data reproduction circuit includes a first comparator having a first threshold voltage between the second level and the third level, and
    the slave-side data reproduction circuit reproduces the write data by determining a voltage level of the superimposed write data using the first threshold voltage.

5. The data communication system according to claim 4, wherein
    the clock reproduction circuit includes an inverter having a third threshold voltage between the second level and the first level, and
    the clock reproduction circuit reproduces the input clock by determining the voltage level of the superimposed write data using the third threshold voltage.

6. The data communication system according to claim 1, wherein
    in a read operation, the first transistor switches according to the input clock,
    in the read operation, the clock reproduction circuit reproduces the input clock and the third transistor switches in response to receipt of both the input clock reproduced by the clock reproduction circuit and the read data so as to superimpose the read data on the input clock to produce superimposed read data to be transmitted via the single-wire communication line, and
    in the read operation, the master-side data reproduction circuit reproduces the read data using the superimposed read data.

7. The data communication system according to claim 6, wherein
    the superimposed read data has a first level according to the input clock, a second level according to the read data, and a third level according to the read data, the second level and the third level being higher than the first level, the second level being different from the third level, the master-side data reproduction circuit includes a second comparator having a second threshold voltage between the second level and the third level, and the master-side data reproduction circuit reproduces the read data by determining a voltage level of the superimposed read data using the second threshold voltage.

8. A sensor device comprising:
a sensor element;
a memory in which control data of the sensor element is stored; and
a slave-side data communication apparatus configured to perform bidirectional communication with a master-side data communication apparatus via a single-wire communication line,
wherein the slave-side data communication apparatus includes:
  a clock reproduction circuit configured to reproduce an input clock transmitted from the master-side data communication apparatus via the single-wire communication line;
  a slave-side data reproduction circuit configured to reproduce write data, as the control data, transmitted from the master-side data communication apparatus via the single-wire communication line; and
  a first transistor which is connected to the single-wire communication line and is configured to perform switching both according to the input clock reproduced by the clock reproduction circuit and according to read data as the control data from the memory.

9. The data communication system according to claim 8, wherein
superimposed write data is produced by superimposing the write data on the input clock and is transmitted via the single-wire communication line, and
in a write operation, the clock reproduction circuit reproduces the input clock using the superimposed write data and the slave-side data reproduction circuit reproduces the write data using the superimposed write data.

10. The data communication system according to claim 9, wherein
the superimposed write data has a first level according to the input clock, a second level according to the write data, and a third level according to the write data, the second level being higher than the first level, the third level being higher than the second level,
the slave-side data reproduction circuit includes a first comparator having a first threshold voltage between the second level and the third level, and
the slave-side data reproduction circuit reproduces the write data by determining a voltage level of the superimposed write data using the first threshold voltage.

11. The data communication system according to claim 10, wherein
the clock reproduction circuit includes an inverter having a third threshold voltage between the second level and the first level, and
the clock reproduction circuit reproduces the input clock by determining the voltage level of the superimposed write data using the third threshold voltage.

12. The data communication system according to claim 8, wherein
in a read operation, the clock reproduction circuit reproduces the input clock and the third transistor switches in response to receipt of both the input clock reproduced by the clock reproduction circuit and the read data so as to superimpose the read data on the input clock to produce superimposed read data to be transmitted via the single-wire communication line.

13. A data communication system, comprising:
a master-side data communication apparatus configured to perform bidirectional communication with a slave side via a single-wire communication line; and
a slave-side data communication apparatus configured to perform bidirectional communication with the master-side data communication apparatus via the single-wire communication line,
wherein the master-side data communication apparatus includes a master-side data reproduction circuit configured to reproduce read data transmitted from the slave-side data communication apparatus via the single-wire communication line,
wherein the slave-side data communication apparatus includes:
  a clock reproduction circuit configured to reproduce the input clock transmitted from the master-side data communication apparatus via the single-wire communication line; and
  a slave-side data reproduction circuit configured to reproduce the write data transmitted from the master-side data communication apparatus via the single-wire communication line, and
wherein
in a read operation, the master-side data communication apparatus transmits the input clock to the slave-side data communication apparatus,
in the read operation, the clock reproduction circuit reproduces the input clock from the master-side data communication apparatus, and the slave-side data communication apparatus superimposes the read data on the input clock to produce superimposed read data to be transmitted via the single-wire communication line, and
in the read operation, the master-side data reproduction circuit reproduces the read data using the superimposed read data.

14. The data communication system according to claim 13, wherein
in a write operation, the master-side data communication apparatus superimposes the write data on the input clock to produce superimposed write data to be transmitted via the single-wire communication line, and
in the write operation, the clock reproduction circuit reproduces the input clock using the superimposed write data and the slave-side data reproduction circuit reproduces the write data using the superimposed write data.

15. The data communication system according to claim 14, wherein
the superimposed write data has a first level according to the input clock, a second level according to the write data, and a third level according to the write data, the second level being higher than the first level, the third level being higher than the second level,
the slave-side data reproduction circuit includes a first comparator having a first threshold voltage between the second level and the third level, and
the slave-side data reproduction circuit reproduces the write data by determining a voltage level of the superimposed write data using the first threshold voltage.

16. The data communication system according to claim 15, wherein the clock reproduction circuit includes an inverter having a third threshold voltage between the second level and the first level, and the clock reproduction circuit reproduces the input clock by determining the voltage level of the superimposed write data using the third threshold voltage.

17. The data communication system according to claim 13, wherein the superimposed read data has a first level according to the input clock, a second level according to the read data, and a third level according to the read data, the second level and the third level being higher than the first level, the second level being different from the third level, the master-side data reproduction circuit includes a second comparator having a second threshold voltage between the second level and the third level, and the master-side data reproduction circuit reproduces the read data by determining a voltage level of the superimposed read data using the second threshold voltage.

18. A sensor device comprising:

a sensor element;

a memory in which control data of the sensor element is stored; and a slave-side data communication apparatus configured to perform bidirectional communication with a master-side data communication apparatus via a single-wire communication line, wherein the slave-side data communication apparatus includes:

a clock reproduction circuit configured to reproduce an input clock transmitted from the master-side data communication apparatus via the single-wire communication line; and a slave-side data reproduction circuit configured to reproduce write data, as the control data, transmitted from the master-side data communication apparatus via the single-wire communication line, and wherein in a read operation, the clock reproduction circuit reproduces the input clock from the master-side data communication apparatus, and the slave-side data communication apparatus superimposes read data, as the control data from the memory, on the input clock to produce superimposed read data to be transmitted via the single-wire communication line.

19. The data communication system according to claim 18, wherein superimposed write data is produced by superimposing the write data on the input clock and is transmitted via the single-wire communication line, and in a write operation, the clock reproduction circuit reproduces the input clock using the superimposed write data and the slave-side data reproduction circuit reproduces the write data using the superimposed write data.

20. The data communication system according to claim 18, wherein the superimposed write data has a first level according to the input clock, a second level according to the write data, and a third level according to the write data, the second level being higher than the first level, the third level being higher than the second level, the slave-side data reproduction circuit includes a first comparator having a first threshold voltage between the second level and the third level, and the slave-side data reproduction circuit reproduces the write data by determining a voltage level of the superimposed write data using the first threshold voltage.

21. The data communication system according to claim 20, wherein the clock reproduction circuit includes an inverter having a third threshold voltage between the second level and the first level, and the clock reproduction circuit reproduces the input clock by determining the voltage level of the superimposed write data using the third threshold voltage.

* * * * *